(12) United States Patent
Marvasti et al.

(10) Patent No.: US 9,729,160 B1
(45) Date of Patent: Aug. 8, 2017

(54) WIDEBAND ANALOG TO DIGITAL CONVERSION BY RANDOM OR LEVEL CROSSING SAMPLING

(71) Applicant: Farokh Marvasti, Watford (GB)

(72) Inventors: Farokh Marvasti, Watford (GB); Mahdi Boloursaz Mashadi, Tehran (IR)

(73) Assignee: Farokh Marvasti, Watford, Hertfordshire (GB)

( * ) Notice: Subject to any disclaimer, the term of this patent is extended or adjusted under 35 U.S.C. 154(b) by 0 days.

(21) Appl. No.: 15/407,981

(22) Filed: Jan. 17, 2017

(51) Int. Cl.
*H03M 1/00* (2006.01)
*H03M 9/00* (2006.01)
*H03M 1/12* (2006.01)

(52) U.S. Cl.
CPC .............. *H03M 1/001* (2013.01); *H03M 9/00* (2013.01); *H03M 1/00* (2013.01); *H03M 1/12* (2013.01)

(58) Field of Classification Search
CPC .................................. H03M 1/00; H03M 1/12
USPC ................ 341/110, 155, 156, 120, 118, 122
See application file for complete search history.

(56) References Cited

U.S. PATENT DOCUMENTS

| | | | |
|---|---|---|---|
| 8,836,557 B2 | 9/2014 | Eldar et al. | |
| 9,197,283 B1 | 11/2015 | Nguyen et al. | |
| 2006/0279445 A1* | 12/2006 | Kinyua | H03M 1/0624 341/155 |
| 2011/0241917 A1 | 10/2011 | Baraniuk et al. | |
| 2013/0038479 A1 | 2/2013 | Eldar et al. | |

* cited by examiner

*Primary Examiner* — Joseph Lauture
(74) *Attorney, Agent, or Firm* — Lewis Roca Rothgerber Christie LLP

(57) ABSTRACT

Circuit and method for encoding an analog signal to a stream of bits at an Analog to Digital Converter (ADC) and subsequent reconstruction of the original signal from the bit stream at a Digital to Analog Converter (DAC), where the ADC module samples the analog signal at a sub-Nyquist rate and encodes the samples to a stream of bits. The bit steam is subsequently used to reconstruct the Nyquist-rate samples of the original analog signal at the DAC. The ADC samples the input signal in one of the two realizations of non-uniform sampling, namely, Random Sampling (RS) and Level Crossing (LC) sampling techniques, according to embodiments of the disclosed invention.

23 Claims, 8 Drawing Sheets

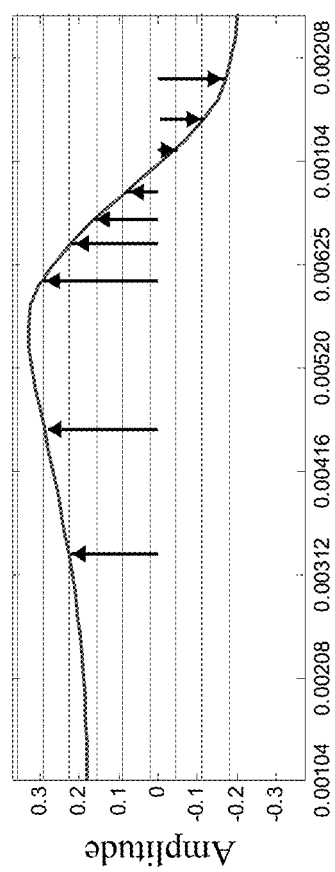
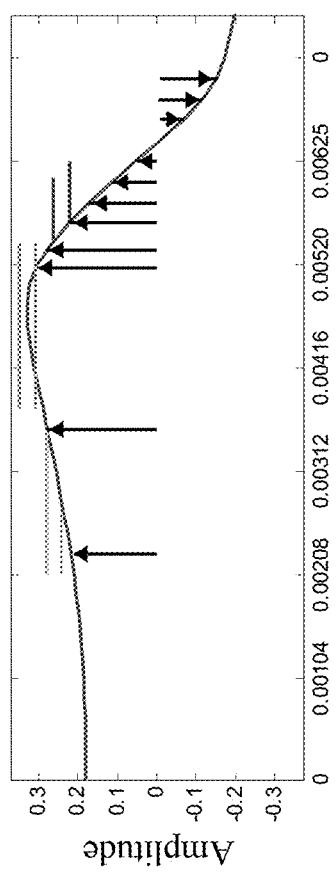

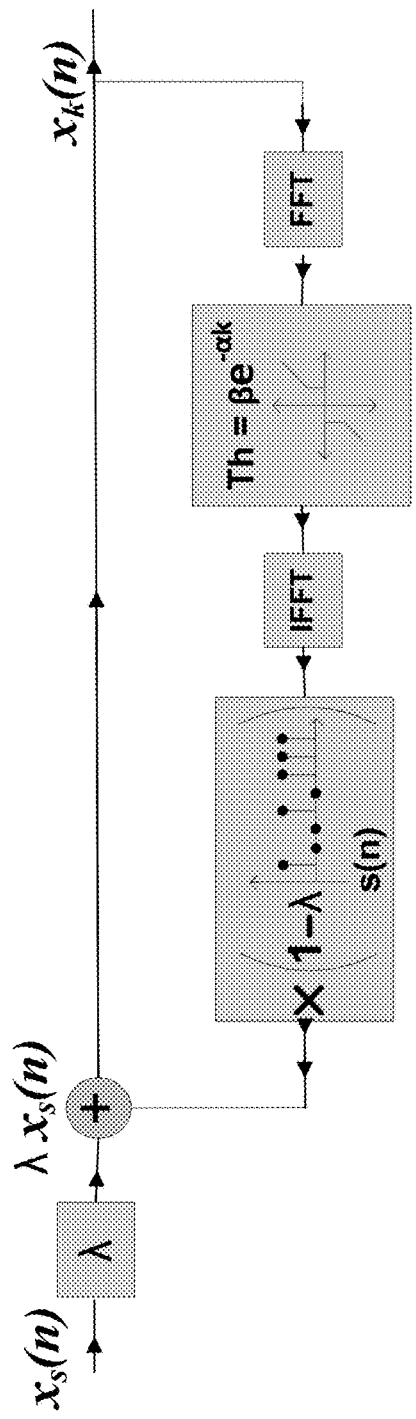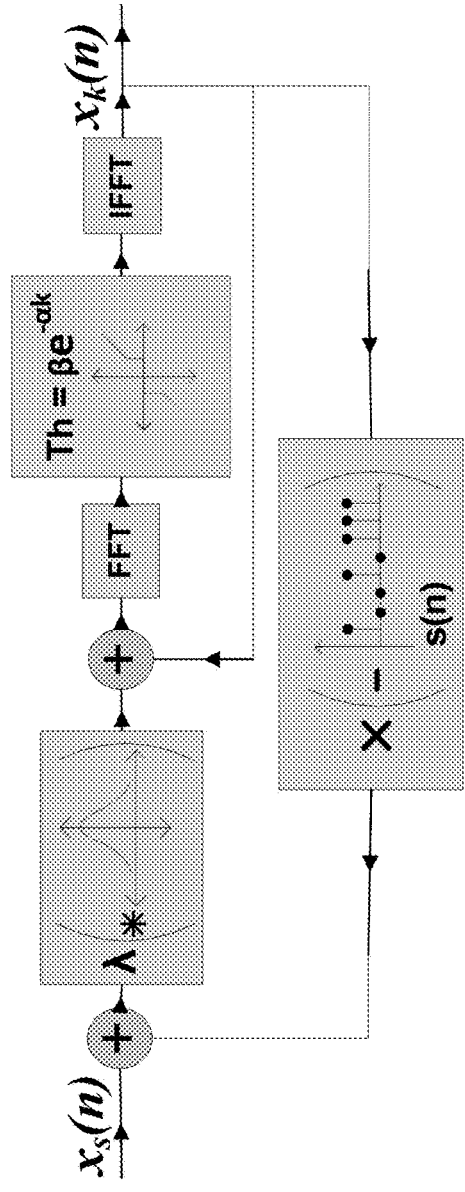
FIG. 9a
FIG. 9b

WIDEBAND ANALOG TO DIGITAL CONVERSION BY RANDOM OR LEVEL CROSSING SAMPLING

FIELD OF THE INVENTION

The disclosed invention generally relates to signal processing and electronic circuits and more particularly to analog to digital conversion by random or level crossing sampling and reconstruction of the resulting signal using an iterative method with adaptive thresholding.

BACKGROUND

The popularity of digital signal processing has caused widespread application of analog to digital converters (ADCs) in modern communication systems. Digital signal processing is utilized in many different applications, such as signal (data, speech, video, etc.) processing, high-speed data converters, radar systems, data communication devices, such as receivers and transmitters and the like.

Moreover, recent demands for sensing wideband analog signals that emerge in various communication systems such as, radar system, cognitive radio systems, ultra-wideband communication systems and the like is forcing the conventional Nyquist rate ADCs towards their performance limits. This is due to the fact that conventional ADCs need to sample analog signals at rates greater than twice the bandwidth of the signal to ensure stable reconstruction of the digitized according to the Nyquist sampling theorem. In many applications, sampling at the Nyquist rate is inefficient because the signals of interest contain only a small number of significant frequencies relative to the band limit, although the locations of the frequencies may not be known a priori.

Additionally, the emerging theory of Compressive Sensing (CS) has shown that this reconstruction to be an inefficient strategy for acquiring signals that have a sparse or compressible representation in terms of an arbitrary basis.

Fortunately, most wideband signals that appear in many practical applications (for example, radar, cognitive radio and ultra-wideband communication systems) are spectrally sparse in the sense that their frequency support includes several limited intervals, spread over a wide spectrum. Although the theory of CS is already developed for discrete signals, research is still ongoing to propose efficient architectures and processes for practical Analog-to-Information Conversion (AIC) techniques that leverage the CS theory to acquire sparse/compressible analog signals at rates reduced far below the Nyquist rate.

Analog (pre-filter) sub-banding followed by Nyquist sampling of analog sub-bands and sub-band channel equalization is commonly invoked to overcome analog-to-digital converter dynamic range limitations. This approach employs a massively parallel implementation wherein the wide frequency region of interest is partitioned into sub-bands by parallel analog band-pass filters. It also requires equalization among adjacent analog sub-band partitions. Also, random demodulation combined with compressive sensing has been proposed for detecting an unknown signal somewhere in a large spectral region. This is a classical single channel random demodulator followed by compressive sensing to unwrap the aliased narrow-band spectrum resulting from under sampling. This approach works for detection of sparse (narrow-band) signals across the wide band of interest, however, it is not suitable for recovery of wideband signals.

FIG. 1 is an exemplary block diagram of a conventional channelized receiver. As shown, a wide band input analog signal X(t), for example, with a frequency of 4 GHz is input to an anti-aliasing filter 102 to reject signals outside of the band of interest. The anti-aliasing bandpass filter (BPF) 102 filter attenuates signals outside of the spectrum of interest. A full Nyquist rate analog-to-digital converter (ADC) 104 with a sampling frequency Fs, equal to or greater than the Nyquist frequency of the input signal, samples the output of the anti-aliasing filter, converting the analog signal to a digital signal. The output of the ADC 104 is then channelized by a (fixed resolution) filter bank 106. The full Nyquist rate ADC 104 samples the entire signal spectrum of interest. Sampled data are separated via the uniform fixed bandwidth filter 106. The filter bank (channelizer) 106 decomposes the wideband signal into equally spaced partitions. Estimated X(t) suffers from ADC dynamic range (maximum to minimum signal) limitation; and distortion (ripple & group delay) of signals wider than the channelizer fixed filter bandwidth.

However, many of the previously proposed approaches to Sub-Nyquist sampling of wideband signals, such as the above-described channelized receiver, require a priori knowledge of the number and locations of the occupied spectral bands and are computationally complex. Also, many of the proposed architectures to implement such approaches provide only an estimate of the sparsely occupied spectrum and are not capable of recovering the underlying wideband signal from the compressive samples.

SUMMARY

In some embodiments, the disclosed invention is methods and circuits that enable sub-Nyquist acquisition and processing of wideband signals.

In some embodiments, the disclosed invention is a method for encoding an analog signal to a stream of digital bits. The method includes: receiving an analog input signal; channelizing the analog input signal to N channels, where N is an integer greater than 1; delaying the analog signal in each channel by a respective delay value of $\tau_i$, where i= 1, . . . N; sampling each delayed signal in each channel at a sub-Nyquist sampling rate of $$\frac{1}{T'},$$

where T' is the frame length in which the analog input signal is processed, wherein there are N samples in each frame of length T'; quantizing each sample of each delayed signal in each channel to a predefined set of l voltage levels to generate b bits of digital signal for each delayed signal in each channel, where l is an odd integer; adjusting a distance d between each consecutive voltage level such that said l voltage levels cover an entire dynamic range of the analog input signal; and serializing the digital signals in each channel to generate a single bit stream of length Nb that represents an entire frame of the input analog signal.

In some embodiments, the disclosed invention is a method for encoding an analog signal to a stream of digital bits. The method includes: receiving an analog input signal; channelizing the analog input signal to L channels, where L is an odd integer greater than 1; sampling the signal in each channel when an amplitude of said signal intersects a respective predefined reference level, wherein the respective predefined reference levels are uniformly spaced as:

$$\mathcal{L} = \left\{ -\frac{L-1}{2}d, -\frac{L-3}{2}d, \ldots, \frac{L-3}{2}d, \frac{L-1}{2}d \right\},$$

where d is the distance between consecutive reference levels; adjusting the distance d between consecutive reference levels such that said L reference levels cover an entire dynamic range of the analog input signal; recording cross levels in each channel and determining a crossing direction for each cross level; encoding a next cross level by a single bit for each level crossing based on the recorded cross level and the crossing direction of the level crossing; outputting the bit stream corresponding to the crossing levels; triggering a timer to output a temporal difference between consecutive cross levels; quantizing the temporal differences with k bits in each channel; and outputting the quantized temporal differences as another bit stream.

In some embodiments, the disclosed invention is a method for encoding an analog signal to a stream of digital bits. The method includes: receiving an analog input signal; channelizing the analog input signal to two or more channels; sampling the signal in each channel when an amplitude of said signal intersects a respective predefined reference level, wherein the respective predefined reference levels are adaptively increased or decreased by a constant value after each sampling event, and wherein a sequence of level crossings for each sampling event determines whether the reference levels need to be increased or decreased for the next sampling event and is represented by a single overhead bit; recording the cross level in each channel and determining a crossing direction for each cross level; encoding a next cross level by a single bit for each level crossing based on the recorded cross level and the crossing direction of the level crossing, wherein the sequence of cross levels for each sampling event determines whether the reference levels need to be increased or decreased for the next sampling event and is represented by a single overhead bit; triggering a timer to output a temporal difference between consecutive cross levels; quantizing the temporal differences with k bits in each channel; and outputting the quantized temporal differences as another bit stream.

The bit stream may then be reconstructed using an iterative method with adaptive thresholding (IMAT) or an iterative method with adaptive thresholding and interpolation (IMATI) methods.

BRIEF DESCRIPTION OF THE DRAWINGS

FIGS. 6a and 6b depict non-uniform samples obtained by LC and ALC sampling schemes, respectively.

FIG. 9a is an exemplary block diagram and signal flow for IMAT process for sub-Nyquist signal reconstruction, according to some embodiments of the disclosed invention.

FIG. 9b is an exemplary block diagram and signal flow for IMATI process for sub-Nyquist signal reconstruction, according to some embodiments of the disclosed invention.

DETAILED DESCRIPTION

In some embodiments, the disclosed invention is a method for encoding an analog signal to a stream of bits at an Analog to Digital Converter (ADC) module (circuit) and subsequent reconstruction of the original signal from the bit stream at the Digital to Analog Converter (DAC) module (circuit). The ADC module samples the analog signal at a sub-Nyquist rate and encodes the samples to a stream of bits. This bit steam is subsequently used to reconstruct the Nyquist-rate samples of the original analog signal at the DAC module.

The ADC module samples the input signal in one of the two realizations of non-uniform sampling, namely, Random Sampling (RS) and Level Crossing (LC) sampling techniques, according to embodiments of the disclosed invention.

In some embodiments, the disclosed invention is a method for sub-Nyquist Analog to Digital conversion of spectrally sparse multiband signals.

In some embodiments, for the reconstruction of the sampled signal, the disclosed invention includes reduced complexity processes, namely, an iterative method with adaptive thresholding (IMAT) for computationally feasible reconstruction of the sampled signal at the DAC module to effectively reconstruct the multiband (sampled) signal. Compared to the conventional methods, the proposed reconstruction method is capable of reconstructing the signal without prior knowledge (or assumption) of its spectral support and the number of occupied bands and their lengths, therefore, resulting in a significantly reduced computational complexity. This reduced computational complexity of the disclosed invention makes it feasible for real-time hardware implementation on graphics processing units (GPUs), digital signal processors (DSPs) and field programmable gate arrays (FPGAs).

Figure 1:
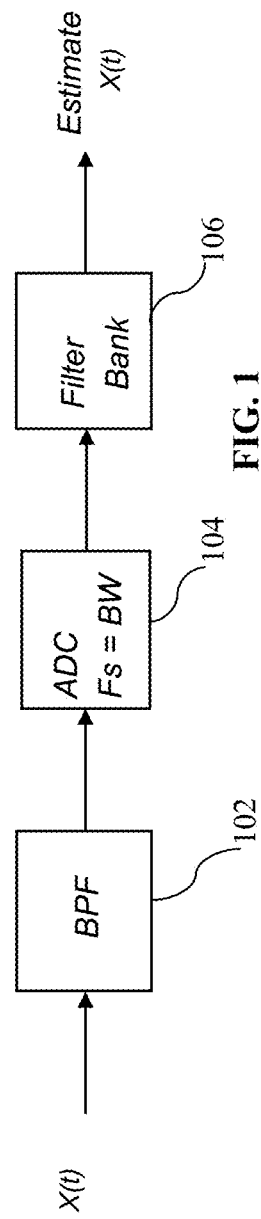
FIG. 1 is a block diagram of an exemplary conventional wideband channelized receiver using single high speed (full Nyquist rate) ADC.
Figure 2:
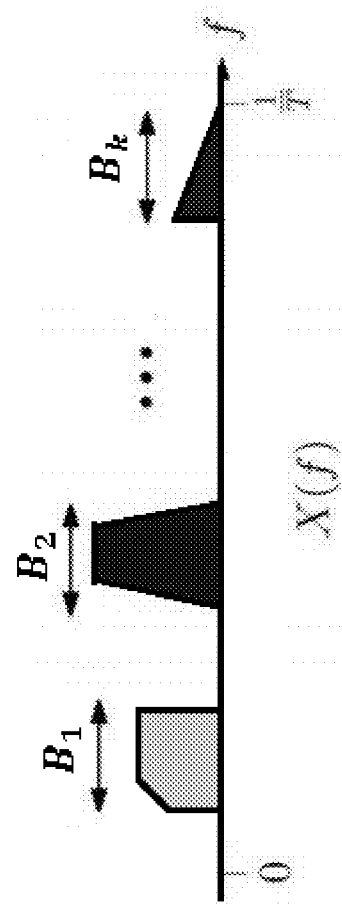
FIG. 2 shows a typical spectrum support for a spectrally sparse wideband analog signal.

FIG. 2 shows a typical spectrum support for a spectrally sparse, wideband analog signal $x(t)$. As shown, $x(t)$ comprises of k sub-bands of widths $B_1, B_2, \ldots, B_k$ and is spectrally sparse in the sense that $B_1+B_2+\ldots+B_k \ll 1/T$, in which T is the Nyquist sampling period.

Enclosed Appendix A provides mathematical theorems and proof for random sampling for sub-Nyquist analog to digital conversion of signals and reconstruction of such signals using IMAT and IMATI methods, the entire contents of which is hereby expressly incorporated by reference.

Enclosed Appendix B provides mathematical theorems and proof for level crossing signal sampling and reconstruction of such signals using IMAT and IMATI methods, the entire contents of which is hereby expressly incorporated by reference.

Random Sampling (RS)

Figure 3:
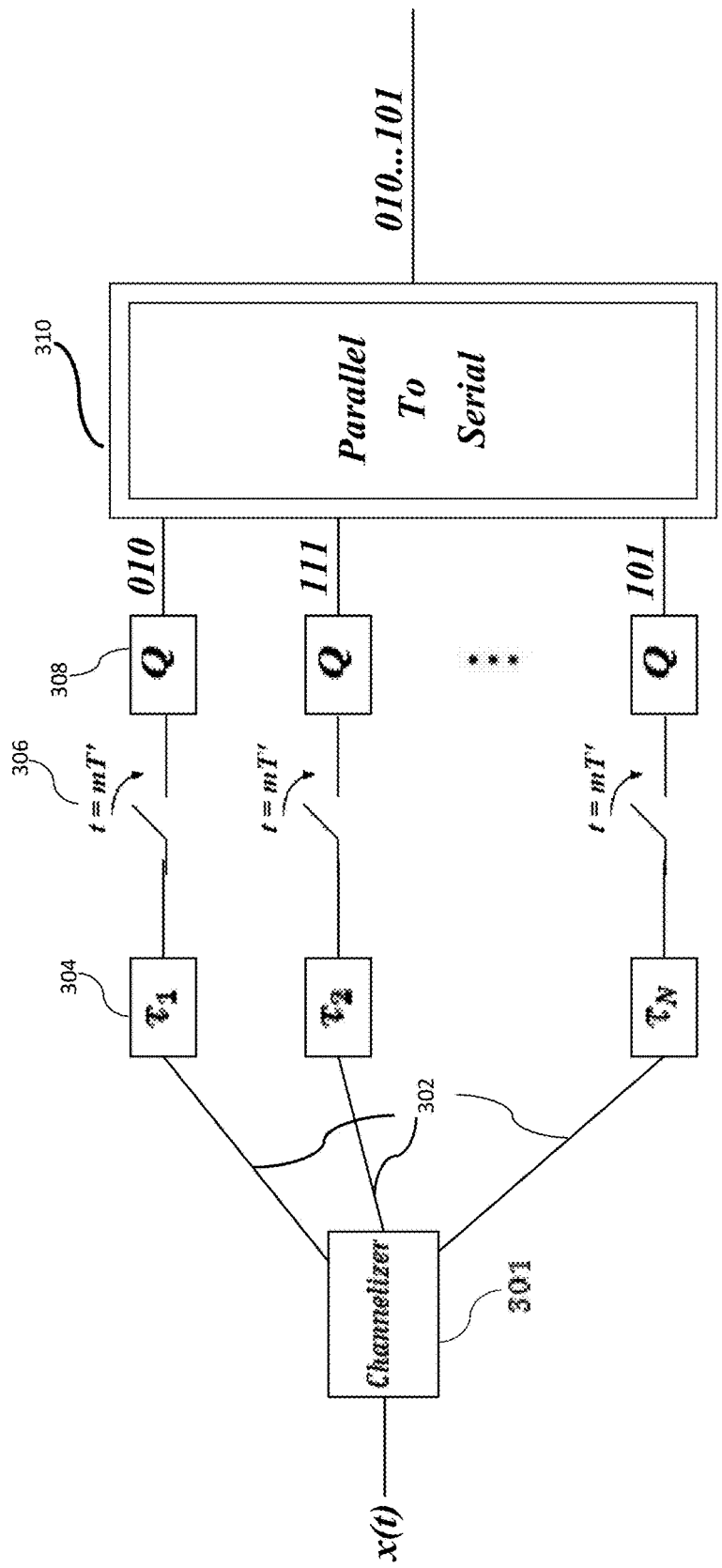
FIG. 3 is an exemplary block diagram and signal flow for random sampling of sub-Nyquist A/D conversion, according to some embodiments of the disclosed invention.

FIG. 3 is an exemplary block diagram and signal flow for random sampling of sub-Nyquist A/D conversion, according to some embodiments of the disclosed invention. As shown, a channelizer 301 distributes an input analog signal X(t) to a plurality of (N) channels 302 to channelize the input signal. In each of the channels 302, the signal goes through different delay elements 304 ($\tau_1, \tau_2, \ldots \tau_N$,) and then is sampled uniformly at a sub-Nyquist rate (i.e. T' ≫ T) by a respective sampler 306. The input signal is processed (sampled and reconstructed) in frames of length T'. For example, the signal in each channel is sampled at integer multiples of T', i.e. (m=0, 1, 2, . . . ). The delay values $\tau_1, \tau_2, \ldots, \tau_N$ are pseudo-randomly distributed to model the random sampling case. In some embodiments, the delay differences $\Delta t_1, \ldots, \Delta T_N$ are a single realization of a set of Independent Identically Distributed (iid) random variables from an exponential($\gamma$) as below:

$\Delta\tau_1 = \tau_1 - 0 \sim \text{exponential}(\gamma)$
$\Delta\tau_2 = \tau_2 - \tau_1 \sim \text{exponential}(\gamma)$
$\Delta\tau_3 = \tau_3 - \tau_2 \sim \text{exponential}(\gamma)$
. . .
$\Delta\tau_N = \tau_N - \tau_{N-1} \sim \text{exponential}(\gamma)$ In which $\gamma$ controls the average sampling rate and as there are N samples in each frame of length T', and $$\frac{N}{T'} = \gamma$$

is obtained. Note that once the delay values $\tau_1, \tau_2, \ldots, \tau_N$ are taken from a realization of exponential distribution functions as above, they are saved and made available both to the samplers 306 and a reconstruction block (described below). In some embodiments, the temporal delay differences $\Delta\tau_1, \Delta\tau_2, \ldots, \Delta\tau_N$ are quantized to integer multiples of a basic temporal resolution $\Delta t$. In order to provide the Nyquist resolution for reconstruction we have $\Delta t \leq T$. That is, in order to model the theoretical case of RS accurately (as considered in the enclosed Appendix A), these delay differences come from iid exponential random variables).

A quantizer 308 in each channel quantizes the samples in each channel to a predefined set of voltage levels and converts them to digital bits. Let $$\mathcal{L} = \left\{ -\frac{l-1}{2}d, -\frac{l-3}{2}d, \ldots, \frac{l-3}{2}d, \frac{l-1}{2}d \right\}$$

denote the set of uniform voltage levels where l is assumed to be an odd integer. The distance between consecutive levels d is adjusted such that these l levels cover the entire dynamic range of the input analog signal. Assuming that $l=2^b$, each quantizer 308 quantizes each sample to its nearest level from L and encodes it to b bits.

In block 310, the bits from different channels are serially put together to form a single bit stream of length Nb that represents the entire frame of the input analog signal. In some embodiments, the bits are put together as:

| 01 ... 0 | 11 ... 1 | ... | 10 ... 1 |
|---|---|---|---|
| b bits from Channel 1 | b bits from Channel 2 | | b bits from Channel N |

The reconstruction process for each digitized frame is described in more details subsequently.

In some embodiments, the random sample (RS) process includes distributing the input analog signal to a plurality of channels. In each channel, the signal goes through different delay elements and is then sampled uniformly at a low frequency rate. The delay values are pseudo-randomly distributed to model the random sampling case. The samples in each channel are then quantized to a predefined set of levels and converted to digital bits. The bits from different channels are subsequently put together to form a single bit stream that represent the input analog signal.

Level Crossing (LC) Sampling

In some embodiments, the disclosed invention samples the input signal (using an ADC circuit) utilizing a Level Crossing (LC) sampling technique. The LC sampling may be performed adaptively or non-adaptively according to embodiments of the disclosed invention. The LC scheme is implemented asynchronously without a global clock at the ADC module. This further decreases power consumption, heating and electromagnetic interference of the ADC circuit.

For example, voice samplers are a key component in digital voice communication systems. In these systems, the input speech is sampled uniformly at the ADC block and the sample values are then quantized. These uniform samples are then input to a voice compression block to extract their redundancy prior to transmission. The voice compression block saves bandwidth and transmission power during the long silence periods observed among voice activity intervals.

The disclosed invention utilizes LC ADCs that reduce the sampling redundancy by adaptive adjustment of the sampling density to the local spectral properties of the input signal. LC ADCs quantize and encode the time instances of the level crossings. In fact, LC is an appropriate sampling scheme for bursty and non-stationary signals, such as voice signals and alleviates the need for subsequent compression by a conventional Voice Activity Detection (VAD) block.

Figure 4:
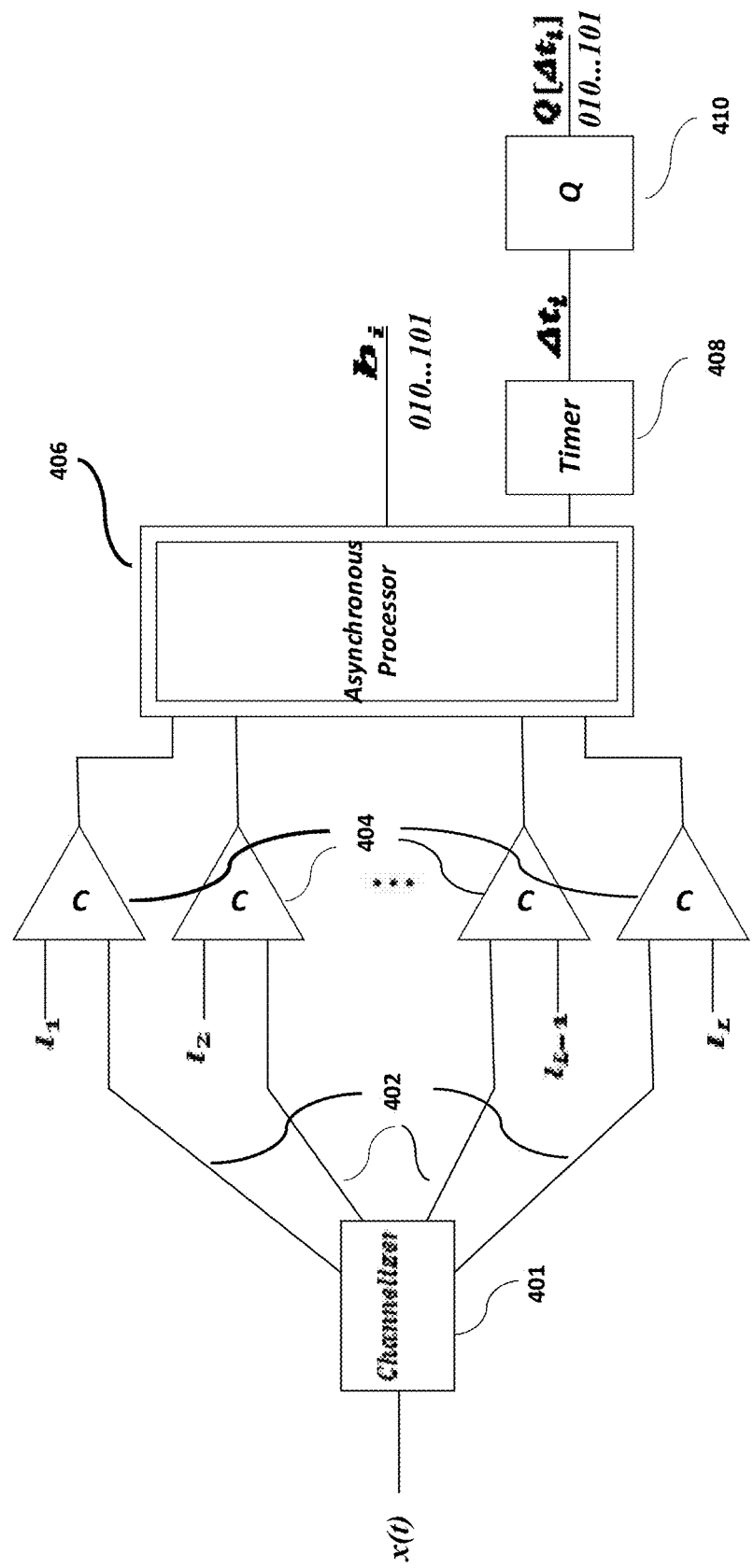
FIG. 4 is an exemplary block diagram and signal flow for Level Crossing sampling of sub-Nyquist A/D conversion, according to some embodiments of the disclosed invention.

FIG. 4 is an exemplary block diagram and signal flow for non-adaptive LC sampling, according to some embodiments of the disclosed invention. In the non-adaptive LC ADCs, a signal sample is taken when the signal amplitude intersects a predefined reference level. The predefined levels may be optimized if prior knowledge about the statistical signal properties is available. Here, the general case of uniformly spaced levels is considered. Let $$\mathcal{L} = \left\{ -\frac{L-1}{2}d, -\frac{L-3}{2}d, \ldots, \frac{L-3}{2}d, \frac{L-1}{2}d \right\}$$

denote the predefined set of uniform levels where L is assumed to be an odd integer. The distance between consecutive levels d is adjusted such that these L levels cover the entire dynamic range of the input analog signal. Hence, LC sampling results in non-uniform samples, in which the n'th sample is represented by a non-uniformly spaced time instance $t_n$ and the crossed level $l_n \in \mathcal{L}$ where $x(t_n) = l_n$ and x(t) denotes the input signal. In this asynchronous LC-based ADC, the time difference between consecutive samples is quantized and digitally encoded along with another bit of overhead that represents the value of the crossed level $l_n$. Also, the temporal differences are quantized to integer multiples of a basic temporal resolution $\Delta t$. In order to provide the Nyquist resolution for reconstruction we have $\Delta t \leq T$.

Referring now to FIG. 4, as shown a channelizer 402 distributes an input analog signal to a plurality of (L) channels 402 to channelize the input signal. In each channel, the signal is compared with one of the reference levels from L using a respective comparator 404. An asynchronous processor 406 is triggered by a sign change in any of the comparator outputs. The processor 406 records the crossed level. In some embodiments, the predefined levels are known and the output is "1" or "0." The asynchronous processor constantly monitors the comparator outputs as an L digit binary number. Note that at each sampling instance, this binary number includes only a single "1," while all the other digits are zero. The location of the "1" at each sampling instance represents which of the L reference levels is crossed at that sampling instance. Hence the processor can record the crossed level by recording the location of the "1s" and recognize whether it is an upward or downward crossing (crossing direction).

Knowing the level crossed at the previous sampling instance and the corresponding crossing direction, the subsequent level crossed can be encoded by a single bit $b_i$. Although, these levels are pre-defined, the temporal instances that these pre-defined levels cross the input signal vary according to the input waveform. To encode the signal, the ADC needs to recognize which level crosses the waveform at which temporal instance. The asynchronous processor 406 encodes the crossed level and triggers a timer 408. The timer 408 outputs the temporal difference between consecutive crossings. A quantizer 410 quantizes the temporal differences with a finite number of bits denoted by $\Delta T$, the maximum temporal difference observed between consecutive sampling instances. In order to quantize this value, at least k bits are needed for quantization in which $$\left(2^k = \frac{\Delta T}{\Delta t}\right)$$

and outputs the corresponding bit stream.

Figure 5:
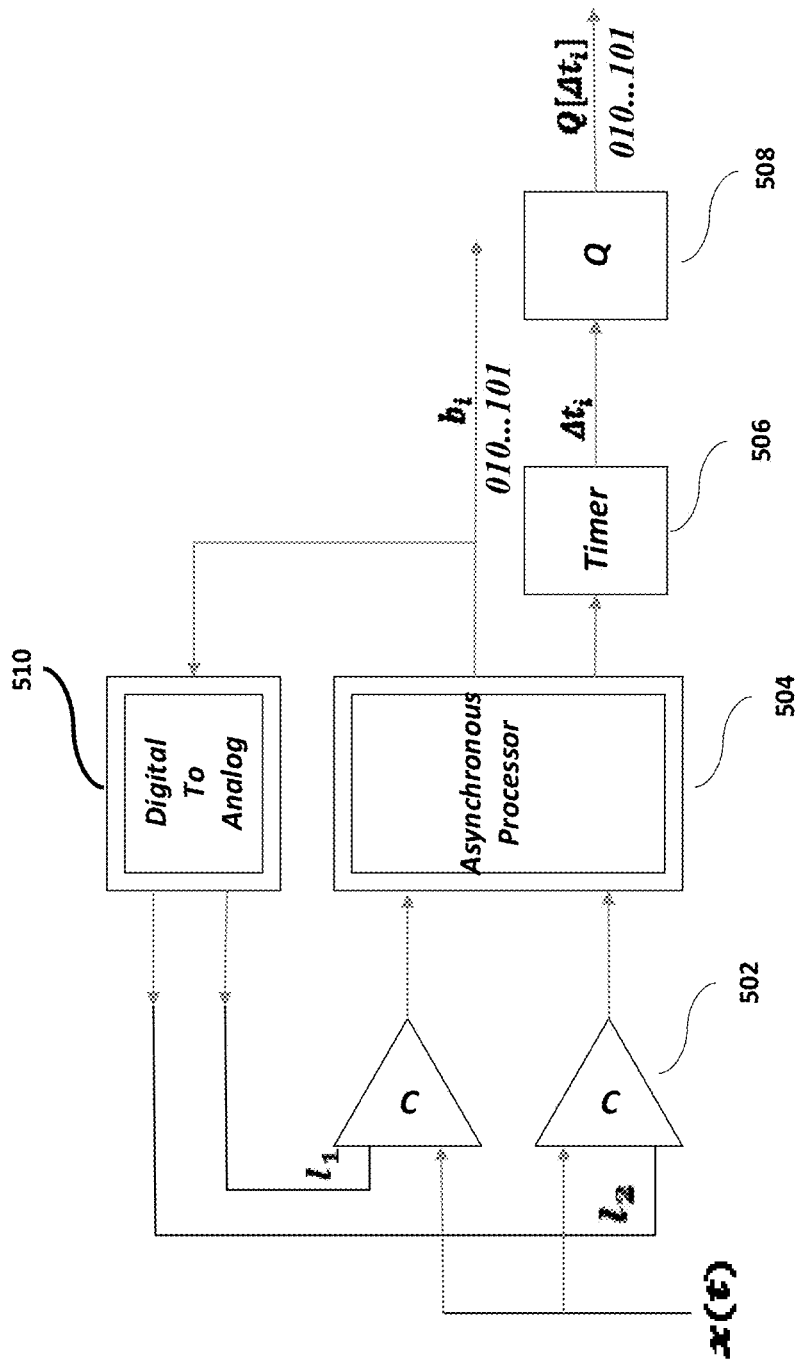
FIG. 5 is an exemplary block diagram and signal flow for Adaptive Level Crossing of sub-Nyquist A/D conversion, according to some embodiments of the disclosed invention.

FIG. 5 is an exemplary block diagram and signal flow for adaptive LC (ALC) sampling, according to some embodiments of the disclosed invention. In some embodiments, the disclosed invention performs LC sampling using an ALC approach. In this approach, there are only two crossing levels that adaptively span the entire dynamic range of the input signal. The levels are adaptively increased or decreased by a constant value after each sampling event. The sequence (ordering) of the two level crossings (reference levels) for each sampling event determines whether the signal is in an increasing (positive slope) region, decreasing (negative slope) region or experiencing an extremum (sign changing slope). This in turn decides whether the two levels need to be increased or decreased for the next sampling event and can be represented by only one bit of overhead. Hence, in the ALC scheme, each sample is represented by its time instance and another bit of overhead both representing the intersecting level (upper or lower reference level) and the direction of adapting (increase or decrease) the reference levels for the next sampling event. Similar to the non-adaptive LC scheme, the temporal differences between consecutive sampling instances are quantized and encoded for asynchronous implementation. Note that the temporal differences are quantized to integer multiples of a basic temporal resolution $\Delta t$. Hence, unlike the non-adaptive LC scheme, no prior knowledge about the dynamic range of the input signal is needed.

Referring now to FIG. 5, an input analog signal is received and compared with the levels $l_1$ and $l_2$ in the comparators $502_1$ and $502_2$. An asynchronous processor 502 is triggered by the sign changes in the comparators outputs. The processor 502 records the crossed level and determines the crossing direction by determining whether the crossed level is an upward or downward crossing. The input analog signal is sampled at its first intersection with any of the two levels $l_1$ and $l_2$. The crossed level is encoded by a single bit $b_i$. The asynchronous processor 502 encodes the crossed level and triggers a timer 506. Timer 506 outputs the temporal difference between consecutive crossings. A quantizer 508 quantizes the temporal differences with k bits and outputs the corresponding bit stream. Note that knowing the crossing directions (the sequence of the two level crossings for each sampling event), determines whether the signal is in an increasing (positive slope) region, a decreasing (negative slope) region or experiencing an extremum (sign changing slope).

This in turn decides whether the two levels need to be increased or decreased for the next sampling event and thus can be deducted from the same bit $b_i$. If the lower level crosses the signal before the upper one, the signal is in a positive slope region and the levels are increased for the next sampling event. If the upper level crosses the signal before the lower one, the signal is in a negative slope region and the levels are decreased. Finally, if both crossings occur with the upper/lower level, the levels are increased/decreased. This way, the two crossing levels adaptively span the entire dynamic range of the input signal. A digital-to-analog converter (DAC) 510 inputs $b_i$ and generates the adapted levels for the next sampling event in the feedback loop to the comparators.

In some embodiments, the Adaptive Level Crossing (ALC) sampling technique includes setting two or more initial level values and sampling the input signal at its first intersection with any of the two (or more) levels. After each sampling event, adaptively increase or decrease each level by a constant value. The sequence (ordering) of the level crossings for each sampling event determines whether the signal is in an increasing (positive slope) region, decreasing (negative slope) region or experiencing an extremum (sign changing slope). If the lower level crosses the signal before the upper one, the signal is in a positive slope region and the levels are increased for the next sampling event. If the upper level crosses the signal before the lower one, the signal is a negative slope region and the levels are decreased. Finally, if both crossings occur with the upper/lower level, the levels are increased/decreased. This way, the two crossing levels adaptively span the whole dynamic range of the input signal. Each sample of the input signal is then represented by its time instance and another bit of overhead that both represents the intersecting level (upper or lower reference level) and the direction of adapting (increase or decrease) the reference levels for the next sampling event. The temporal differences between consecutive sampling instances are quantized and encoded to form the output bit stream along with the one bit overhead representing the crossing level.

FIGS. 6a and 6b depict the non-uniform samples obtained by LC and ALC sampling schemes, respectively. As illustrated, the sampling rate is adapted automatically to the local spectral bandwidth of the input signal in the sense that the LC/ALC samples are sparsely located in the slowly varying regions of the input signal and densely located in high slope regions to capture sudden jumps/falls.

Reconstruction

Once the analog input signal is sampled, quantized and encoded by the RS and/or LC sample methods, the resulting bit stream signal needs to eventually be reconstructed to represent its original form. Note that by reconstruction of the original signal, reconstruction of the Nyquist rate samples from the bit stream is intended. That is, the bit-stream encodes the sub-Nyquist samples and the Nyquist rate samples may then be reconstruct from it. This is accomplished by the following IMAT and IMATI methods using an iterative method. Note that similar to the sampling process, reconstruction is also performed frame by frame. The reconstruction process utilizes the sub-Nyquist sampled signal $x_s(n)$ and the corresponding sampling mask $s(n)$ that represents the sampling time instances on the grid formed by integer multiples of the temporal resolution $\Delta t$. $x_s(n)$ includes the signal values on the Sub-Nyquist sampling instances and is zero (missing sample values) elsewhere on the Nyquist grid. The goal of reconstruction is to estimate the values of the missing samples.

Figure 7:
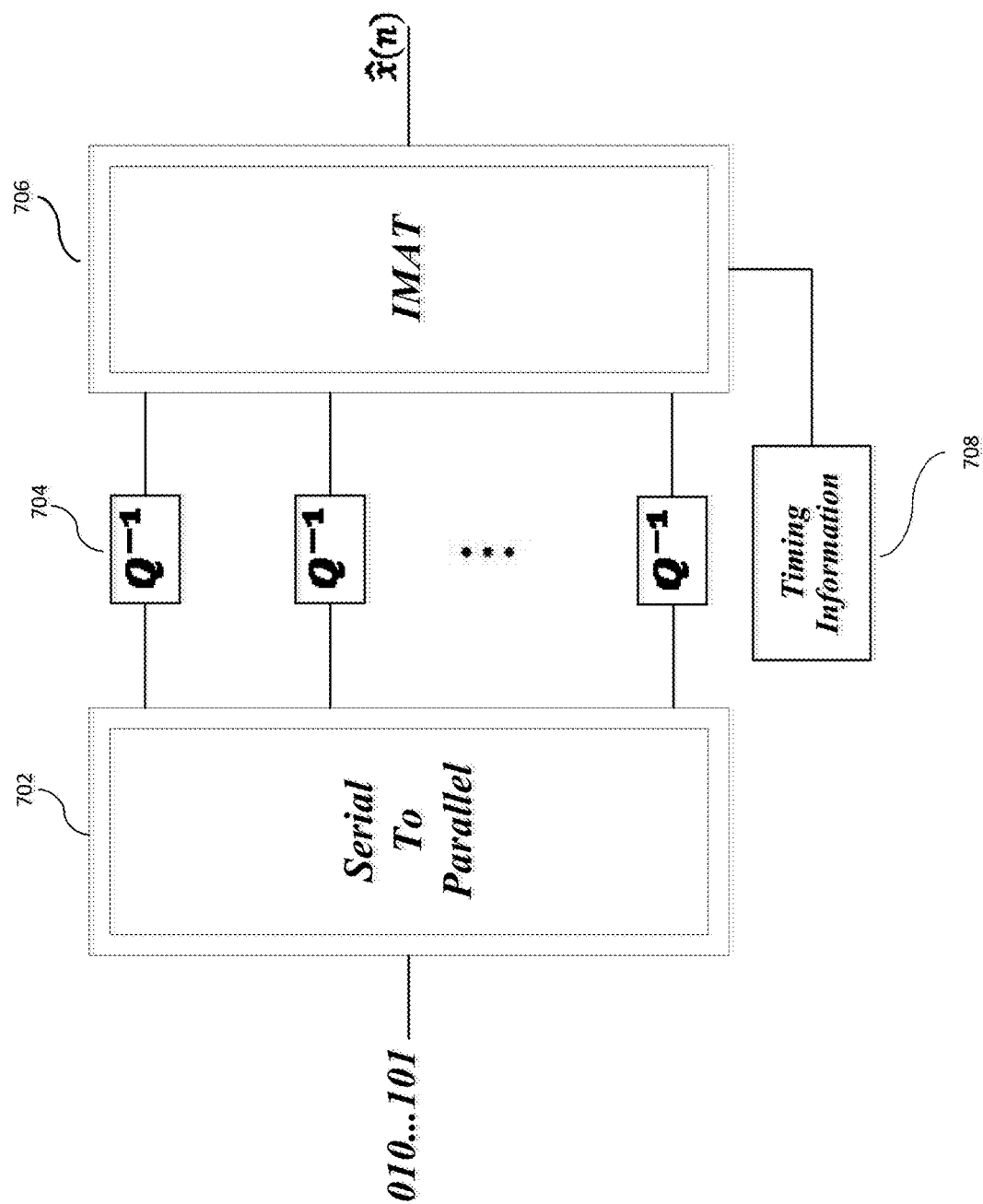
FIG. 7 is an exemplary block diagram and signal flow for reconstructing the original signal from the encoded bit stream of random samples, according to some embodiments of the disclosed invention.

FIG. 7 is an exemplary block diagram and signal flow for reconstruction of the original signal from the bit stream resulting from random samples. The input bit stream is divided to blocks of b bits each and distributed to different channels by a conventional serial-to parallel converter circuit 702. De-quantizer circuits 704 convert each b bit to the corresponding sample value (De-quantization) to provide $x_s(n)$ needed for IMAT/IMATI reconstruction. A memory 708 provides the delay values $\tau_1, \tau_2, \ldots, \tau_N$ of the bit stream from random samples needed for reconstruction (the sampling mask $(s(n))$. Finally, an IMAT/IMATI circuit 706 reconstructs the Nyquist rate samples to produce an analog signal representing its original form, by performing an IMAT/IMATI process described below.

Figure 8:
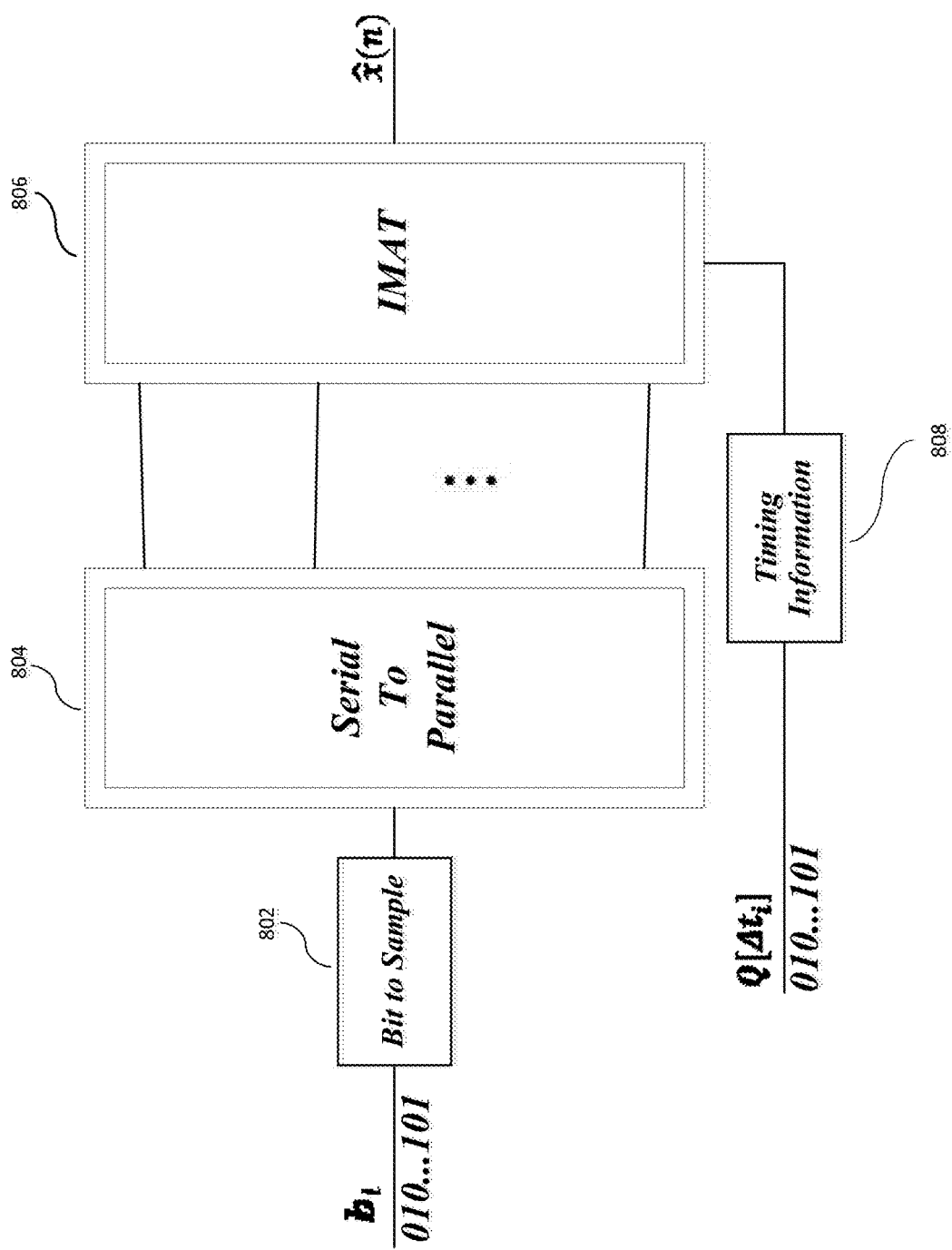
FIG. 8 is an exemplary block diagram and signal flow for reconstructing the original signal from the encoded bit stream of LC/ALC samples, according to some embodiments of the disclosed invention.

FIG. 8 is a block diagram and signal process flow for reconstruction of the original signal from the bit stream resulting from LC/ALC samples. A decoder 802 maps each bit $b_i$ to the corresponding level values in non-adaptive or adaptive LC cases. A conventional serial-to parallel converter circuit 804 provides the parallel sample values from the level values decoded by decoder 802 to provide $x_s(n)$ for reconstruction. A memory 808 provides the sampling instances from the quantized crossing times (temporal differences) and hence provides $s(n)$ for reconstruction of the corresponding frame. An IMAT circuit 806 reconstructs the Nyquist rate samples by performing the proposed IMAT/IMATI process as demonstrated in the following.

FIGS. 9a and 9b are exemplary block diagram and signal flows for the reconstruction processes of IMAT (Iterative Method with Adaptive Thresholding) and IMATI (IMAT with Interpolation). This process gradually extract the sparse signal components by iterative thresholding of the estimated signal (in the FFT domain) thereby promoting sparsity. Note that as the sampling instances are quantized, the samples are located on a grid (placed at integer multiples of the temporal resolution $\Delta t$) and hence we need to assume a discrete signal model for analytical studies. The iterative reconstruction formulas according to some embodiments of the disclosed invention are given as IMAT: $x_{k+1}(n) = \lambda x_s(n) + (1-\lambda s(n))\mathfrak{I}(x_k(n))$     1a IMATI: $x_{k+1}(n) = \mathfrak{I}(x_k(n) + \lambda \mathcal{J}(x_s(n) - s(n)x_k(n)))$     1b where, $x(n)$ and $x_k(n)$ are the original signal and its reconstructed version at the kth iteration, $\lambda$ is a relaxation parameter that controls the convergence of the iterations, and $\mathfrak{I}(\bullet)$ and $\mathcal{J}(\bullet)$ denote the thresholding and interpolation operators. Any of the well-known interpolation techniques of sample and hold, linear interpolation, spline and etc. can be used as the interpolation operator $\mathcal{J}(\bullet)$. The thresholding operator $\mathfrak{I}(\bullet)$ transforms the input signal to a sparse domain (for example, FFT, DCT, etc.), sets the signal components with absolute values below the threshold Th(k) to zero and transforms them back to the original time domain.

Finally, $s(n)$ is a binary sampling mask and $x_s(n)$ is the sampled signal given by $$x_s(n) = s(n)x(n) \quad (2)$$

$$s(n) = \sum_i \delta(n - n_i)$$

where, $\delta(\bullet)$ denotes the Kronecker delta function, m is the frame length, and $0 \leq n_i \leq m-1$ denotes the sampling time instances. This $s(n)$ is used for IMAT and IMATI reconstruction according to equations 1a and 1b.

Equation 1a and 1b denote two different approaches, IMAT and IMATI, respectively. In the IMAT approach, the iterative IMAT formula given by 1a is composed of a recursion step followed by thresholding. The thresholding step is interpreted as projection onto the sparse signal space $\Sigma_p$ defined as the set of all signals having equal or less than p nonzero components in the sparse signal domain (FFT, DCT, etc.). IMATI adds an additional interpolation step to each iteration of the IMAT process. This additional step improves the reconstruction quality for signals that can be considered as a combination of a lowpass part plus high frequency but sparse components.

As shown, the threshold value Th is decreased exponentially by $Th(k) = \beta e^{-\alpha k}$ where k is the iteration number. The process performance is less dependent on the choice of the process parameters $\gamma$, $\beta$, $\alpha$ but these parameters are optimized empirically for fastest convergence. It should also be noted that a few iterations (~10) of the process is sufficient for reconstruction.

In some embodiments, if the threshold value is decreased too fast, there exists the risk of picking up signal components that are not in support of the original signal. This causes the spectrum variance to increase and/or causes the final quality of the reconstructed signal to degrade. On the other hand, if the threshold value is decreased too slowly, the threshold may not pick any signal components in several consecutive iterations which means that the cost function will not improve for several iterations. This in turn may slow down the convergence rate of the process. However, the proposed exponential function works well regarding both these issues.

By utilizing the nonlinear thresholding operator ($\mathfrak{I}(\bullet)$) in the IMAT-based reconstruction approach, the high frequency and sparse signal components can be reconstructed without prior knowledge of the number of sparse coefficients or their locations (signal support). As a result, the performance improvement achieved by IMAT-based reconstruction process over the previous methods is due to migrating from the traditional low pass filters to the sparse signal assumption.

In some embodiments, when the input signal is a voice/audio signal, the temporal resolution is set as $$\Delta t = \frac{1}{48 \text{ kHz}} = 2.08 \times 10^{-5} \text{ sec.}$$

This is equivalent to a frequency of 48 kHz for reconstruction at the DAC module and hence ensures that all the frequency components in the human audible range (20 Hz to 20 kHz) are accommodated.

The ADC and DAC of the present invention reduce sampling frequency (sub-Nyquist sampling) and hence output data rate, improve signal quality by sparsity promoting reconstruction using IMAT in comparison with the conventional low pass based ADCs, improve signal quality by avoiding the anti-aliasing filter distortion present in the conventional ADCs, reduce energy consumption in the sampling circuitry by reducing the sampling rate according to the reduced sampling frequency, further reduce energy consumption in the LC/ALC sampling processes by asynchronous implementation of the sampler, and reduce electromagnetic interference and heating of the circuitry by asynchronous implementation. Accordingly, the disclosed invention improves a myriad of different technologies that use analog to digital converters, such as communication systems, digital signal processing (data, speech, video, and the like processing), high-speed data converters, radar systems, data communication devices, such as receivers and transmitters and the like.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope of the invention as defined by the appended claims and drawings.

APPENDIX A

Theorem 1:

The frequency transform of a missing sampled signal $X_s(e^{j\omega}) = \Im\{x_s(n)\}$ is a random variable with mean and variance given by $$E\{X_s(e^{j\omega})\} = pX(e^{j\omega})$$

$$E\{|X_s(e^{j\omega}) - pX(e^{j\omega})|^2\} = (p-p^2)\in_x \quad (3)$$

in which $\in_x = \Sigma_{n=-\infty}^{\infty}|x(n)|^2$.

Proof:

By definition we have $$E\{X_s(e^{j\omega})\} = E\left\{\sum_{n=-\infty}^{\infty} x_s(n)e^{-j\omega n}\right\}$$

$$\sum_{n=-\infty}^{\infty} E\{x_s(n)\}e^{-j\omega n} = p\sum_{n=-\infty}^{\infty} x(n)e^{-j\omega n} = pX(e^{j\omega})$$

This proves the expected value equation. Similarly, for the variance equation we have $$E\{|X_s(e^{j\omega}) - pX(e^{j\omega})|^2\} = \quad (4)$$

$$E\left\{\left|\sum_{n=-\infty}^{\infty}[x_s(n) - px(n)]e^{-j\omega n}\right|^2\right\} = E\left\{\left|\sum_{n=-\infty}^{\infty}[x_s(n) - px(n)]e^{-j\omega n}\right|^2\right\} =$$

$$E\left\{\left(\sum_{n=-\infty}^{\infty}[x_s(n) - px(n)]e^{-j\omega n}\right)\left(\sum_{m=-\infty}^{\infty}[x_s(m) - px(m)]e^{-j\omega m}\right)^*\right\} =$$

$$E\left\{\left(\sum_{n=-\infty}^{\infty}[x_s(n) - px(n)]e^{-j\omega n}\right)\left(\sum_{m=-\infty}^{\infty}[x_s(m) - px(m)]e^{j\omega m}\right)\right\} =$$

$$\sum_n \sum_m E\{[x_s(n) - px(n)][x_s(m) - px(m)]\}e^{j\omega(m-n)} =$$

$$\sum_{n=-\infty}^{\infty} E[(x_s(n) - px(n))^2] +$$

$$\sum_n \sum_{m \neq n} E\{[x_s(n) - px(n)][x_s(m) - px(m)]\}e^{j\omega(m-n)}$$

Now, we calculate the above two terms separately. For the first term we have $$\sum_{n=-\infty}^{\infty} E[(x_s(n) - px(n))^2] = p\sum_{n=-\infty}^{\infty}(x(n) - px(n))^2 + (1-p)\sum_{n=-\infty}^{\infty}(-px(n))^2 =$$

$$p(1-p)^2\varepsilon_x + p^2(1-p)\varepsilon_x = (p-p^2)\varepsilon_x$$

Hence we need to show that the double sigma term in (4) equals zero. We have $\Sigma_n\Sigma_{m\neq n}E\{[x_s(n)-px(n)][x_s(m)-px(m)]\}e^{j\omega(m-n)}$ $=p^2\Sigma_n\Sigma_{m\neq n}[x(n)-px(n)][x(k)-px(k)]e^{j\omega(m-n)}$ $+(1-p)^2\Sigma_n\Sigma_{m\neq n}[-px(n)][-px(k)]e^{j\omega(m-n)}$ $+p(1-p)\Sigma_n\Sigma_{m\neq n}[x(n)-px(n)][-px(k)]e^{j\omega(m-n)}$ $+p(1-p)\Sigma_n\Sigma_{m\neq n}[-px(n)][x(k)-px(k)]e^{j\omega(m-n)}$ $=p^2(1-p)^2\Sigma_n\Sigma_{m\neq n}x(n)x(m)e^{j\omega(m-n)}$ $+p^2(1-p)^2\Sigma_n\Sigma_{m\neq n}x(n)x(m)e^{j\omega(m-n)}$ $-p^2(1-p)^2\Sigma_n\Sigma_{m\neq n}x(n)x(m)e^{j\omega(m-n)}$ $-p^2(1-p)^2\Sigma_n\Sigma_{m\neq n}x(n)x(m)e^{j\omega(m-n)}$ $=0$ Which completes the proof.

Theorem 2:

Denote by $x_{ls}(n)$ the frequency transform of a missing sampled signal after causal sample and holding. Now, $X_{ls}(e^{j\omega}) = \Im\{x_{ls}(n)\}$ is a random variable with mean and variance given by $$E\{X_{IS}(e^{j\omega})\} = \frac{p}{A}X(e^{j\omega})$$

$$E\left\{\left|X_{ls}(e^{j\omega}) - \frac{p}{A}X(e^{j\omega})\right|^2\right\} = \quad (5)$$

$$\left(1 + \frac{p^2}{|A|^2}\right)\varepsilon_x - 2p^2\text{Re}\left\{\frac{1}{A}\right\}\sum_{i=0}^{\infty}(1-p)^i r(i)$$

in which $A = 1 - (1-p)e^{-j\omega}$ and $r(i) = \sum_{n=0}^{\infty}x(n)x(n-i)$.

Proof:

By definition we have $$E\{X_s(e^{j\omega})\} = E\left\{\sum_{n=-\infty}^{\infty} x_s(n)e^{-j\omega n}\right\} = \sum_{n=-\infty}^{\infty} E\{x_s(n)\}e^{-j\omega n} \quad (6)$$

On the other hand, according to the missing sampling and casual sample and holding properties, $E\{x_s(n)\}$ can be calculated as below $$E\{x_s(n)\} = px(n) + p(1-p)x(n-1) + \ldots = p\sum_{i=0}^{\infty}(1-p)^i x(n-i)$$

Now, substitution in (6) gives $$E\{X_s(e^{j\omega})\} =$$

$$p\sum_{n=-\infty}^{\infty}\left(\sum_{i=0}^{\infty}(1-p)^i x(n-i)\right)e^{-j\omega n} = p\sum_{i=0}^{\infty}(1-p)^i\left(\sum_{n=-\infty}^{\infty} x(n-i)e^{-j\omega n}\right) =$$

$$pX(e^{j\omega})\sum_{i=0}^{\infty}(1-p)^i e^{-j\omega i} = \frac{pX(e^{j\omega})}{1-(1-p)e^{-j\omega}} = \frac{p}{A}X(e^{j\omega})$$

Which proves the expected value equation. Similarly for variance we get $$E\left\{\left|X_{ls}(e^{j\omega}) - \frac{p}{A}X(e^{j\omega})\right|^2\right\} = \quad (7)$$

$$E\left\{\left(\sum_{n=-\infty}^{\infty}\left(x_{ls}(n) - \frac{p}{A}x(n)\right)e^{-j\omega n}\right)\left(\sum_{m=-\infty}^{\infty}\left(x_{ls}(m) - \frac{p}{A^*}x(n)\right)e^{j\omega m}\right)\right\} =$$

$$\sum_n\sum_m E\left\{\left[x_{ls}(n) - \frac{p}{A}x(n)\right]\left[x_{ls}(m) - \frac{p}{A^*}x(m)\right]\right\}e^{j\omega(m-n)} =$$

$$\sum_{n=-\infty}^{\infty} E\left[\left(x_{ls}(n) - \frac{p}{A}x(n)\right)\left(x_{ls}(n) - \frac{p}{A^*}x(n)\right)\right] +$$

$$\sum_n\sum_{m\neq n} E\left\{\left[x_{ls}(n) - \frac{p}{A}x(n)\right]\left[x_{ls}(m) - \frac{p}{A^*}x(m)\right]\right\}e^{j\omega(m-n)}$$

Now, we calculate the above two terms separately. For the first term we have $$\sum_{n=-\infty}^{\infty} E\left[\left(x_{ls}(n) - \frac{p}{A}x(n)\right)\left(x_{ls}(n) - \frac{p}{A^*}x(n)\right)\right] = \quad (8)$$

$$\sum_{n=-\infty}^{\infty} E\left[(x_{ls}(n))^2 - \frac{p}{A^*}x(n)x_{ls}(n) - \frac{p}{A}x(n)x_{ls}(n) + \frac{p}{|A|^2}(x(n))^2\right]$$

We have $$\sum_{n=-\infty}^{\infty} E[x_{ls}(n)^2] =$$

$$p\sum_{n=-\infty}^{\infty} x(n)^2 + p(1-p)\sum_{n=-\infty}^{\infty} x(n-1)^2 + \ldots = p\varepsilon_x\sum_{i=0}^{\infty}(1-p)^i = \varepsilon_x$$

Similarly, we get $$\sum_{n=-\infty}^{\infty} E[x_{ls}(n)x(n)] = p\sum_{n=-\infty}^{\infty} x(n)^2 + p(1-p)\sum_{n=-\infty}^{\infty} x(n)x(n-1) +$$

$$p(1-p)^2\sum_{n=-\infty}^{\infty} x(n)x(n-2) + \ldots = \sum_{i=0}^{\infty} p(1-p)^i r(i)$$

Now, substitution in (8) gives $$\sum_{n=-\infty}^{\infty} E\left[(x_{ls}(n))^2 - \frac{p}{A^*}x(n)x_{ls}(n) - \frac{p}{A}x(n)x_{ls}(n) + \frac{p}{|A|^2}(x(n))^2\right] =$$

$$\varepsilon_x\left(1 + \frac{p^2}{|A|^2}\right) - 2p^2\mathrm{Re}\left\{\frac{1}{A}\right\}\sum_{i=0}^{\infty} p(1-p)^i r(i)$$

Now, we need to show that the double sigma term in (7) equals zero. We have $$\sum_n\sum_{m\neq n} E\left\{\left[x_{ls}(n) - \frac{p}{A}x(n)\right]\left[x_{ls}(m) - \frac{p}{A^*}x(m)\right]\right\}e^{j\omega(m-n)} =$$

$$\sum_n\sum_{m\neq n}\sum_k\sum_l \left(x(n-k) - \frac{p}{A}x(n)\right)$$

$$\left(x(m-l) - \frac{p}{A^*}x(m)\right)p^2(1-p)^{k+l}e^{j\omega(m-n)} =$$

$$\sum_n\sum_{m\neq n}\sum_k\sum_l x(n-k)x(m-l)p^2(1-p)^{k+l}e^{j\omega(m-n)} +$$

$$\frac{p^2}{|A|^2}\sum_n\sum_{m\neq n}\sum_k\sum_l x(n)x(m)p^2(1-p)^{k-l}e^{j\omega(m-n)} -$$

$$\frac{p}{A^*}\sum_n\sum_{m\neq n}\sum_k\sum_l x(n-k)x(m)p^2(1-p)^{k+l}e^{j\omega(m-n)} -$$

$$\frac{p}{A}\sum_n\sum_{m\neq n}\sum_k\sum_l x(n)x(m-l)p^2(1-p)^{k+l}e^{j\omega(m-n)}$$

Further mathematical manipulation gives $$\sum_n\sum_{m\neq n}\sum_k\sum_l x(n-k)x(m-l)p^2(1-p)^{k+l}e^{j\omega(m-n)} = \quad (9)$$

$$\sum_{n'}\sum_{m'\neq n'}\sum_k\sum_l x(n')x(m')p^2(1-p)^{k+l}e^{j\omega(m'-n')}e^{j\omega(l-k)} =$$

$$\frac{p^2}{(1-(1-p)e^{j\omega})(1-(1-p)e^{-j\omega})}$$

$$\sum_{n'}\sum_{m'\neq n'} x(n')x(m')e^{j\omega(m'-n')} = \frac{p^2}{|A|^2}S$$

In which $S = \sum_n\sum_{m'\neq n} x(n')\times(m')e^{j\omega(m'-n')}$. Similarly for the second terms in we get $$\frac{p^2}{|A|^2}\sum_n\sum_{m\neq n}\sum_k\sum_l x(n)x(m)p^2(1-p)^{k+l}e^{j\omega(m-n)} = \quad (10)$$

$$\frac{p^4}{|A|^2} \times \frac{1}{1-(1-p)} \times \frac{1}{1-(1-p)} \times$$

$$\sum_{n'}\sum_{m'\neq n'} x(n')x(m')e^{j\omega(m'-n')} = \frac{p^2}{|A|^2}S$$

Similarly we have $$-\frac{p}{A^*}\sum_n\sum_{m\neq n}\sum_k\sum_l x(n-k)x(m)p^2(1-p)^{k+l}e^{j\omega(m-n)} = -\frac{p^2}{|A|^2}S \quad (11)$$

And $$-\frac{p}{A}\sum_n\sum_{m\neq n}\sum_k\sum_l x(n)x(m-l)p^2(1-p)^{k+l}e^{j\omega(m-n)} = -\frac{p^2}{|A|^2}S \quad (12)$$

Finally, (9)-(12) yields the desired result as $$\sum_n\sum_{m\neq n} E\left\{\left[x_{ls}(n) - \frac{p}{A}x(n)\right]\left[x_{ls}(m) - \frac{p}{A^*}x(m)\right]\right\}e^{j\omega(m-n)} = 0$$

The proof is complete.

IMAT Convergence Analysis

In this section, we justify IMAT convergence for random sampling and then we generalize our results to LC sampling by the spectral similarities observed for the two sampling schemes.

Theorem 3:

Considering IMAT reconstruction formula given by (1) and denoting the frequency transform coefficients by capitalized letters, $$\lim_{k \to \infty} X_k(e^{j\omega})$$

is an unbiased estimator of $X(e^{j\omega})$ for $$0 < \lambda < \frac{2}{p}.$$

Proof:

As stated by Theorem 1, the frequency transform of the missing sampled signal $X_s(e^{j\omega}) = \Im\{x_s(n)\}$ is a random variable with mean and variance given by $$E\{X_s(e^{j\omega})\} = pX(e^{j\omega})$$

$$E\{|X_s(e^{j\omega}) - pX(e^{j\omega})|^2\} = (p-p^2)\in_x \quad (13)$$

Where $\in_x = \sum_{n=0}^{N-1}|x(n)|^2$. Now if we denote the signal support by $S = \{\omega | X(e^{j\omega}) \neq 0\}$, $X_s(e^{j\omega_j})$ is a random variable with mean and variance equal to $pX(e^{j\omega_j})$ and $(p-p^2)\in_x$ for $\omega_j \in S$. Also for $\omega_j \notin S$ where $E\{X_s(e^{j\omega_j})\} = 0$, $X_s(e^{j\omega_j})$ is a zero mean random variable with variance $(p-p^2)\in_x$.

The iterative IMAT formula (1a) can be rewritten in transform domain as

IMAT: $X_{k+1}(e^{j\omega_j})$ $$= \lambda X_s(e^{j\omega_j}) \quad (14)$$

$$+ \Im\{(1 - \lambda s(n))T(x_k(n))\}$$

Taking $E\{\bullet\}$ From both sides of (14) and applying (13) we get $$E\{X_{k+1}(e^{j\omega_l})\} = \lambda pX(e^{j\omega_l}) + (1$$

$$-\lambda p)E\{\Im\{T(x_k(n))\}\} \quad (15)$$

Now for $\omega_l$ such that $|X_k(e^{j\omega_l})| \geq \text{Th}(k)$, the thresholding operator can be omitted from the right side which yields $$E\{X_{k+1}(e^{j\omega_l})\} = \lambda pX(e^{j\omega_l}) + (1 - \lambda p)E\{X_k(e^{j\omega_l})\}$$

This is a recursive relation in terms of $b_k = E\{X_k(e^{j\omega_l})\}$ which can be solved by taking the z-transform of both sides as ($B(z)$ denotes the z-transform of $b_k$)

$$zB(z) - zb_0 = \frac{\lambda pX(e^{j\omega_l})}{1 - z^{-1}} + (1 - \lambda p)B(z) \quad (16)$$

Now, considering zero initial condition $x_0(n) = 0$ yields $b_0 = 0$. Solving (16) we get $$b_k = E\{X_k(e^{j\omega_l})\} = X(e^{j\omega_l})(1 - (1 - \lambda p)^k) \quad (17)$$

It is known that $\lim_{k \to \infty} E\{X_k(e^{j\omega_l})\} = X(e^{j\omega_l})$ if and only if $|1 - \lambda p| < 1$ or equivalently $$0 < \lambda < \frac{2}{p}$$

Hence, as long as a frequency component exceeds the threshold, its expected value approaches its exact value as $k \to \infty$.

Now consider the following two scenarios:

Scenario 1:

For $\omega_j \notin S$, if the threshold picks $X_k(e^{j\omega_j})$, then according to (17), $E\{X_{k+1}(e^{j\omega_j})\} = 0$. On the other hand, if $X_k(e^{j\omega_j})$ is not picked up by the threshold we get $E\{X_{k+1}(e^{j\omega_j})\} = \lambda pX(e^{j\omega_j}) = 0$ according to (15). Hence in either case we get $E\{X_{k+1}(e^{j\omega_j})\} = 0$ for $\omega_j \notin S$.

Scenario 2:

For $\omega_j \notin S$, if the threshold picks the signal component $X_k(e^{j\omega_j})$ and $\omega_j \in S$, then $E\{X_k(e^{j\omega_j})\}$ starts to grow and approaches $X_k(e^{j\omega_j})$ as $k \to \infty$ and as the threshold is strictly decreasing, all non-zero signal components (signal support) will be picked up gradually.

Hence, in both scenarios, $\lim_{k \to \infty} E\{X_k(e^{j\omega})\} = X(e^{j\omega})$, $\forall \omega$ and the proof is complete.

It can be concluded from theorem 1 that $X_{k+1}(e^{j\omega})$ is a random variable with its expected value approaching $X(e^{j\omega})$ as $k \to \infty$. In other words, we have proved that the IMAT algorithm converges to the original signal in the mean. But in order to guarantee perfect reconstruction/convergence of the IMAT algorithm, we also need to show that the variance of this unbiased estimator approaches zero as $k \to \infty$. Theorem 2 explains this variance fluctuation issue as k approaches infinity.

Theorem 4:

Assume that the threshold picks $X_k(\omega_j)$ in the k'th iteration of the IMAT algorithm, this decreases the spectrum variance if $\omega_j \in S$ and increases the variance for $\omega_j \notin S$.

Proof:

Let's decompose $T(x_k(n))$ as $$T(x_k(n)) = p_{k+1}(n) + q_{k+1}(n) \quad (17)$$

In which $p_{k+1}(n)$ only consists of signal support S components and $q_{k+1}(n)$ includes other components picked by the threshold. In other words, $p_{k+1}(n)$ is the portion reconstructed by the algorithm up to the k'th iteration and $q_{k+1}(n)$ is the non-support portion picked up mistakenly by the threshold due to non-zero spectrum variance. Now let's also decompose $x(n)$ as the sum of its reconstructed portion $p_{k+1}(n)$ and a residual $r_{k+1}(n)$ as $$x(n) = p_{k+1}(n) + r_{k+1}(n) \quad (18)$$

Substituting (17) and (18) in (1) gives

IMAT: $x_{k+1}(n) = \lambda s(n)x(n)$ $$+ (1 - \lambda s(n))T(x_k(n))$$

$$x_{k+1}(n) = \lambda s(n)(p_{k+1}(n) + r_{k+1}(n)) \quad (19)$$

$$+ (1 - \lambda s(n))(p_{k+1}(n)$$

$$q_{k+1}(n))$$

$$x_{k+1}(n) = \lambda s(n)r_{k+1}(n) - \lambda s(n)q_{k+1} + p_{k+1}(n)$$

$$q_{k+1}(n)$$

The last two terms in (19) ($p_{k+1}(n)$ and $q_{k+1}(n)$) are not random sampled and hence their frequency transform is deterministic and do not contribute to the spectrum variance. This yields that $$\sigma_{k+1}^2 = E\{(X_{k+1}(e^{j\omega}) - E\{X_{k+1}(e^{j\omega})\})^2\} \quad (20)$$

$$= \lambda^2(p-p^2)\in_{r_{k+1}}$$

$$+ \lambda^2(p-p^2)\in_{q_{k+1}}$$

In which $\in_{r_{k+1}}$ and $\in_{q_{k+1}}$ denote the energies of the residual and mistakenly picked frequency components, respectively. Now, each mistakenly picked component $\omega_j \notin S$ increases $\in_{q_{k+1}}$ and consequently the spectrum variance. Similarly, for a correctly picked signal component $\omega_j \in S$, $\in_{r_{k+1}}$ and consequently the spectrum variance $\sigma_{k+1}^2$ is decreased. The above discussion completes the proof.

Remark 1:

As stated previously, due to the non-zero spectrum variance, $X_k(e^{j\omega})$ is non-zero for $\omega_j \notin S$. Hence, the threshold parameters must be adjusted such that the threshold value always keeps above the standard deviation of the spectrum (e.g. $Th(k) \geq \gamma \sigma_k$, $\gamma > 1$) to prevent the algorithm from picking up incorrect frequency components. In this case, $\in_{q_{k+1}} = 0$ and the spectrum variance is decreasing in each iteration $\sigma_{k+1}^2 \leq \sigma_k^2$.

Corollary 1:

Considering Theorem 1, we conclude that the IMAT estimation bias approaches zero as k approaches infinity. On the other hand, the variance of the IMAT estimation is decreasing provided that the condition in Remark 1 ($\in_{q_{k+1}} = 0$, $\forall k$) always holds. Now considering the fact that the Mean Square Error (MSE) of the estimator is given by (21)

$$MSE_k = E\{(X_k(e^{j\omega}) - X(e^{j\omega}))^2\}$$

$$= (E\{X_k(e^{j\omega})\} - X(e^{j\omega}))^2 + \sigma_k^2 \quad (21)$$

Now as both terms in (21) are decreasing, we conclude that $MSE_k$ is also decreasing. In other words, the cost function for IMAT algorithm is the Mean Square Error of the estimated signal in transform domain. On the other hand, this cost function is convex which yields that it has a unique local and simultaneously global minimum Finally, as this cost function is iteratively decreasing, it will approach its global minimum Remark 2:

If the threshold value is decreased too fast, there exists the risk of picking up signal components that are not in signal support. This will increase the spectrum variance or equivalently degrade the final quality of the reconstructed signal. On the other hand, if it is decreased too slowly, the threshold may not pick any signal components in several consecutive iterations which means that the cost function will not improve for several iterations. This in turn slows down the algorithm's convergence rate.

IMATI Convergence Analysis

Theorem 5:

Considering IMATI reconstruction formula given by (1b) and denoting the frequency transform coefficients by capitalized letters, $\lim_{k \to \infty} X_k(e^{j\omega})$ is an unbiased estimator of $X(e^{j\omega})$ for $0 < \lambda < 2p$.

Proof:

As stated by theorem 2, the frequency transform of the missing sampled and casually sample and holded signal $X_{ls}(e^{j\omega}) = \Im\{x_{ls}(n)\}$ is a random variable with mean and variance given by $$E\{X_{ls}(e^{j\omega})\} = \frac{p}{A} X(e^{j\omega}) \quad (22)$$

The iterative IMATI formula (1b) can be rewritten in transform domain as

IMATI: $X_{k+1}(e^{j\omega})$ $$= T(X_k(e^{j\omega})) \quad (23)$$

$$+ \lambda \Im\{I(x_{ls}(n) - s(n)x_k(n))\}$$

Taking $E\{\cdot\}$ From both sides of (23) and applying (22) we get $$E\{X_{k+1}(e^{j\omega})\} = E\{T(X_k(e^{j\omega}))$$

$$+ \lambda \Im\{I(x_{ls},n) - s(n)x_k(n))\}\} \quad (24)$$

Now consider $\omega_l$ to be a frequency component that passes the threshold of the current iteration. For this frequency component, the thresholding operator can be omitted from the right side which yields $$E\{X_{k+1}(e^{j\omega_l})\} = E\{X_k(e^{j\omega_l}) + \lambda F\{I(x_s(n) - s(n)x_k(n))\}\} =$$

$$E\{X_k(e^{j\omega_l})\} + \lambda E\{F\{I(x_s(n))\}\} - \lambda E\{F\{I(s(n)x_k(n))\}\} =$$

$$\frac{\lambda p}{A} X(e^{j\omega_l}) + \left(1 - \frac{\lambda p}{A}\right) E\{X_k(e^{j\omega_l})\}$$

This is a recursive relation in terms of $b_k = E\{X_k(e^{j\omega_l})\}$ which can be solved by taking the z-transform of both sides as $B(z)$ denotes the z-transform of $b_k$ $$zB(z) - zb_0 = \frac{\lambda p X(e^{j\omega_l})}{A(1 - z^{-1})} + \left(1 - \frac{\lambda p}{A}\right) B(z) \quad (25)$$

Now, considering zero initial condition $x_0(n) = 0$ yields $b_0 = 0$. Solving (25) we get $$b_k = E\{X_k(e^{j\omega_l})\} = X(e^{j\omega_l}) \left(1 - \left(1 - \frac{\lambda p}{A}\right)^k\right) \quad (26)$$

It is known that $\lim_{k \to \infty} E\{X_k(e^{j\omega_j})\} = X(e^{j\omega_j})$ if and only $$\text{if } \left|1 - \frac{\lambda p}{A}\right| < 1$$

or equivalently $|A - \lambda p|^2 < |A|^2$. Now, by substituting $A = 1 - (1-p)e^{-j\omega}$ and some mathematical manipulations we get $$((1 - \lambda p) - (1-p)\cos(\omega))^2 < (1 - (1-p)\cos(\omega))^2$$

Or equivalently $$-(1 - (1-p)\cos(\omega)) < (1 - \lambda p) - (1-p)\cos(\omega) < 1 - (1-p)\cos(\omega)$$

Which gives $$0 < \lambda < 2 - 2(1-p)\cos(\omega)$$

In order for $\lambda$ to satisfy the convergence condition for all $-\pi \leq \omega \leq \pi$, we must have $$0 < \lambda < 2p$$

Hence, similar to the IMAT case, as long as a frequency component exceeds the threshold, its expected value approaches its exact value as $k \to \infty$.

Now consider the following two scenarios:

Scenario 1:

For $\omega_j \notin S$, if the threshold picks $X_k(e^{j\omega_j})$, then according to (26), $E\{X_{k+1}(e^{j\omega_j})\} = 0$. On the other hand, if $X_k(e^{j\omega_j})$ is not picked up by the threshold we get $E\{X_{k+1}(e^{j\omega_j})\} = \lambda p X(e^{j\omega_j}) = 0$ according to (24). Hence in either case we get $E\{X_{k+1}(e^{j\omega_j})\} = 0$ for $\omega_j \notin S$.

Scenario 2:

For $\omega_j \notin S$, if the threshold picks the signal component $X_k(e^{j\omega_j})$ and $\omega_j \notin S$, then $E\{X_k(e^{j\omega_j})\}$ starts to grow and approaches $X_k(e^{j\omega_j})$ as $k \to \infty$ and as the threshold is strictly decreasing, all non-zero signal components (signal support) will be picked up gradually.

Hence, in both scenarios, $\lim_{k \to \infty} E\{X_k(e^{j\omega})\} = X(e^{j\omega})$, $\forall \omega$ and the proof is complete.

Theorem 6:

Denote the un-thresholded signal reconstructed at the k'th IMATI algorithm iteration by $x_k'(n)$, i.e. $x_k(n)=T(x_k'(n))$. Now, assume that the threshold picks $X_k(e^{j\omega_j})$ in the k'th iteration, this decreases the variance of $X_{k+1}'(e^{j\omega})$ if $\omega_j \notin S$ and increases the variance for $\omega_j \notin S$.

Proof:

Similar to the IMAT case, let's decompose $x_k(n)=T(x_k'(n))$ as $$x_k(n)=T(x_k'(n))=p_{k+1}(n)+q_{k+1}(n) \quad (27)$$

In which $p_{k+1}(n)$ only consists of signal support S components and $q_{k+1}(n)$ includes other components picked by the threshold. In other words, $p_{k+1}(n)$ is the portion reconstructed by the algorithm up to the k'th iteration and $q_{k+1}(n)$ is the non-support portion picked up mistakenly by the threshold due to non-zero spectrum variance. Now let's also decompose $x(n)$ as the sum of its reconstructed portion $p_{k+1}(n)$ and a residual $r_{k+1}(n)$ as $$x(n)=p_{k+1}(n)+r_{k+1}(n) \quad (28)$$

Substituting (27) and (28) in (1b) gives

IMATI: $x_{k+1}'(n)=x_k(n)+\lambda J(x_s(n)-s(n)x_k(n))$ $x'_{k+1}(n)=p_{k+1}(n)+q_{k+1}(n)+\lambda J(s(n)(p_{k+1}(n)s(n)_{k+1}(n)+q_{k+1}(n)))+r_{k+1}(n))$ $x'_{k+1}(n)=p_{k+1}(n)+q_{k+1}(n)+\lambda J(s(n)r_{k+1}(n)-s(n)q_{k+1}(n)) \quad (29)$ A discussion similar to the proof for theorem 4 yields that the first two terms in (29) ($p_{k+1}(n)$ and $q_{k+1}(n)$) are not random sampled and hence their frequency transform is deterministic and do not contribute to the spectrum variance. This yields that according to theorem 2, $\sigma_{k+1}^2=E\{(X_{k+1}'(e^{j\omega})-E\{X_{k+1}'(e^{j\omega})\})^2\}$ only depends on the energies and correlations of the residual signal ($\in_{r_{k+1}}$, $r_{r_{k+1}}(1)$, $r_{r_{k+1}}(2)$, ...) and the mistakenly picked frequency components ($\in_{q_{k+1}}$, $r_{q_{k+1}}(1)$, $r_{q_{k+1}}(2)$, ...). Hence, each mistakenly picked component $\omega_j \notin S$ increases the spectrum variance. Similarly, for a correctly picked signal component $\omega_j \notin S$, the spectrum variance $\sigma_{k+1}^2$ is decreased and the proof is complete.

Remark 1:

As stated previously, due to the non-zero spectrum variance, $X_k(e^{j\omega_j})$ is non-zero for $\omega_j \notin S$. Hence, the threshold parameters must be adjusted such that the threshold value always keeps above the standard deviation of the spectrum (e.g. $Th(k) \geq \gamma \sigma_k$, $\gamma>1$) to prevent the algorithm from picking up incorrect frequency components. In this case, $\in_{q_{k+1}}=0$ and the spectrum variance is decreasing in each iteration $\sigma_{k+1}^2 \leq \sigma_k^2$.

Corollary 1:

Considering Theorem 1, we conclude that the IMATI estimation bias approaches zero as k approaches infinity. On the other hand, the variance of the IMATI estimation is decreasing provided that the condition in Remark 1 ($\in_{q_{k+1}}=0$, $\forall k$) always holds. Now considering the fact that the Mean Square Error (MSE) of the estimator is given by (30)

$MSE_k=E\{(X_k(e^{j\omega})-X(e^{j\omega}))^2\}$ $=(E\{X_k(e^{j\omega})\}-X(e^{j\omega}))^2+\sigma_k^2 \quad (30)$ Now as both terms in (30) are decreasing, we conclude that $MSE_k$ is also decreasing. In other words, the cost function for IMATI algorithm is also the Mean Square Error of the estimated signal in transform domain. On the other hand, this cost function is convex which yields that it has a unique local and simultaneously global minimum Finally, as this cost function is iteratively decreasing, it will approach its global minimum Remark 2:

If the threshold value is decreased too fast, there exists the risk of picking up signal components that are not in signal support. This will increase the spectrum variance or equivalently degrade the final quality of the reconstructed signal. On the other hand, if it is decreased too slowly, the threshold may not pick any signal components in several consecutive iterations which means that the cost function will not improve for several iterations. This in turn slows down the algorithm's convergence rate.

REFERENCES

[1] J. A. Tropp, J. N. Laska, M. F. Duarte, J. K. Romberg and R. G. Baraniuk, "Beyond Nyquist: Efficient Sampling of Sparse Bandlimited Signals," in *IEEE Transactions on Information Theory*, vol. 56, no. 1, pp. 520-544, January 2010.

[2] D. L. Donoho, "Compressed sensing," in *IEEE Transactions on Information Theory*, vol. 52, no. 4, pp. 1289-1306, April 2006.

[3] E. J. Cand'es, "Compressive sampling," in *Proc. Int. Congress of Mathematics*, pp. 1433-1452, Spain 2006.

[4] J. Laska et al., "Random Sampling for Analog-to-Information Conversion of Wideband Signals," *Design, Applications, Integration and Software, 2006 IEEE Dallas/CAS Workshop on*, Richardson, Tex., 2006, pp. 119-122.

[5] J. A. Tropp, M. B. Wakin, M. F. Duarte, D. Baron and R. G. Baraniuk, "Random Filters for Compressive Sampling and Reconstruction," *Acoustics, Speech and Signal Processing, 2006. ICASSP 2006 Proceedings. 2006 IEEE International Conference on*, Toulouse, 2006, pp.

[6] J. A. Tropp, "Random Filters for Compressive Sampling," *Information Sciences and Systems, 2006 40th Annual Conference on*, Princeton, N.J., 2006, pp. 216-217.

[7] A. Tropp and A. C. Gilbert, "Signal recovery from random measurements via orthogonal matching pursuit", *IEEE Transaction on Information Theory*, vol. 53, no. 12, pp. 4655-4666, 2007.

[8] W. U. Bajwa, J. D. Haupt, G. M. Raz, S. J. Wright and R. D. Nowak, "Toeplitz-Structured Compressed Sensing Matrices," *Statistical Signal Processing, 2007. SSP '07. IEEE/SP 14th Workshop on*, Madison, Wis., USA, 2007, pp. 294-298.

[9] T. Ragheb et al., "Implementation models for analog-to-information conversion via random sampling," *Circuits and Systems, 2007. MWSCAS 2007. 50th Midwest Symposium on*, Montreal, Que., 2007, pp. 325-328.

[10] S. Pfetsch et al., "On the feasibility of hardware implementation of sub-Nyquist random-sampling based analog-to-information conversion," *Circuits and Systems, 2008. ISCAS 2008. IEEE International Symposium on*, Seattle, Wash., 2008, pp. 1480-1483.

[11] J. N. Laska, S. Kirolos, M. F. Duarte, T. S. Ragheb, R. G. Baraniuk and Y. Massoud, "Theory and Implementation of an Analog-to-Information Converter using Random Demodulation," *Circuits and Systems, 2007. ISCAS 2007. IEEE International Symposium on*, New Orleans, L A, 2007, pp. 1959-1962.

[12] S. Kirolos et al., "Analog-to-Information Conversion via Random Demodulation," *Design, Applications, Inte-* gration and Software, 2006 IEEE Dallas/CAS Workshop on, Richardson, Tex., 2006, pp. 71-74.

[13] J. A. Tropp, J. N. Laska, M. F. Duarte, J. K. Romberg and R. G. Baraniuk, "Beyond Nyquist: Efficient Sampling of Sparse Bandlimited Signals," in *IEEE Transactions on Information Theory*, vol. 56, no. 1, pp. 520-544, January 2010.

[14] G. L. Fudge, R. E. Bland, M. A. Chivers, S. Ravindran, J. Haupt and P. E. Pace, "A Nyquist folding analog-to-information receiver," *Signals, Systems and Computers, 2008 42nd Asilomar Conference on*, Pacific Grove, C A, 2008, pp. 541-545.

[15] M. Mishali and Y. C. Eldar, "Blind Multiband Signal Reconstruction: Compressed Sensing for Analog Signals," in *IEEE Transactions on Signal Processing*, vol. 57, no. 3, pp. 993-1009, March 2009.

[16] M. Mishali and Y. C. Eldar, "From Theory to Practice: Sub-Nyquist Sampling of Sparse Wideband Analog Signals," in *IEEE Journal of Selected Topics in Signal Processing*, vol. 4, no. 2, pp. 375-391, April 2010.

[17] H. J. Landau, "Necessary density conditions for sampling and interpolation of certain entire functions," *Acta Math.*, vol. 117, pp. 37-52, February 1967.

[18] M. Mishali, Y. C. Eldar, O. Dounaevsky and E. Shoshan, "Xampling: Analog to digital at sub-Nyquist rates," in *IET Circuits, Devices & Systems*, vol. 5, no. 1, pp. 8-20, January 2011.

[19] J. Yoo, S. Becker, M. Monge, M. Loh, E. Candès and A Emami-Neyestanak, "Design and implementation of a fully integrated compressed-sensing signal acquisition system," *Acoustics, Speech and Signal Processing (ICASSP), 2012 IEEE International Conference on*, Kyoto, 2012, pp. 5325-5328.

[20] J. Yoo, S. Becker, M. Loh, M. Monge, E. Candès and A. Emami-Neyestanak, "A 100 MHz-2 GHz 12.5x sub-Nyquist rate receiver in 90 nm CMOS," *Radio Frequency Integrated Circuits Symposium (RFIC), 2012 IEEE*, Montreal, Q C, 2012, pp. 31-34.

[21] J. Yoo, A. Khajehnejad, B. Hassibi and A Emami-Neyestanak, "An analog sub-linear time sparse signal acquisition framework based on structured matrices," *Acoustics, Speech and Signal Processing (ICASSP), 2012 IEEE International Conference on*, Kyoto, 2012, pp. 5321-5324.

[22] M. Wakin et al., "A Nonuniform Sampler for Wideband Spectrally-Sparse Environments," in *IEEE Journal on Emerging and Selected Topics in Circuits and Systems*, vol. 2, no. 3, pp. 516-529, September 2012.

[23] D. E. Bellasi, L. Bettini, C. Benkeser, T. Burger, Q. Huang and C. Studer, "VLSI Design of a Monolithic Compressive-Sensing Wideband Analog-to-Information Converter," in *IEEE Journal on Emerging and Selected Topics in Circuits and Systems*, vol. 3, no. 4, pp. 552-565, December 2013.

APPENDIX B

Before proceeding, we need to rewrite the algorithms in vector format. The iterative IMAT formula can be represented in vector notation by (3), in which $X_{N\times 1}=[x(0), x(1), \ldots, x(N)]^t$ and $X_{k_{N\times 1}}=[x_k(0), x_k(1), \ldots, x_k(N)]^t$. The sampling operation is also modeled as multiplication by a submatrix of identity denoted by $S_{M\times N}$ (M<N). $S_{M\times N}$ is obtained by keeping the rows corresponding to the sampling instances and omitting others from $I_{N\times N}$. Hence, $Y_{M\times 1}=SX$ denotes the vector of the sampled signal. The thresholding operator $\mathfrak{I}(\bullet)$ also operates element wise when applied to signal vectors.

$$\text{IMAT: } X_{k+1}=\mathfrak{I}(X_k)+\lambda S^t(Y-ST(X_k)) \tag{3}$$

Similarly, the iterative IMATI formula can be written in vector format as (5)

$$\text{IMATI: } X_{k+1}=\mathfrak{I}(X_k+\lambda\mathcal{J}(S^t(Y-SX_k))) \tag{4}$$

Theorem 1 derives the above reconstruction formula (3) from the Gradient Projection (GP) algorithm.

Theorem 1:

The iterative reconstruction formula given by (3), is derived by applying the GP technique to the following SE minimization problem subjected to signal sparsity constraint.

$$\text{Argmin}_{\hat{X}}\|Y-S\hat{X}\|_2^2 \tag{5}$$

S. t.

$\hat{X}$ is sparse in an arbitrary basis

Proof:

The iterative IMAT formula given by (3) is composed of a recursion step followed by thresholding. The thresholding step is interpreted as projection onto the sparse signal space $\Sigma_l$ defined as the set of all signals having equal or less than 1 nonzero components in the sparse signal domain. The recursion step itself can be derived by moving the current solution $X_k$ in the reverse direction of the gradient of the objective function to achieve $X_{k+1}$. The gradient of the objective function is calculated as $$\frac{\partial}{\partial X}\|Y-SX\|_2^2 = \frac{\partial}{\partial X}(Y-SX)^t(Y-SX) =$$

$$\frac{\partial}{\partial X}(Y^tY-Y^tSX-X^tS^tY+X^tS^tSX)=2S^t(SX-Y)$$

Hence, applying the steepest descent algorithm we get:

$$X_{k+1}=X_k\lambda S^t(Y-SX_k)$$

Which results in (3) adding thresholding. As the sparse signal domain $\Sigma_l$ is the union of convex subspaces each having a specific pattern for the nonzero transform components, the overall algorithm in convergent according to [24, 25].

The above reasoning is true regardless of the choice of the underdetermined matrix S. Hence, by replacing S with an arbitrary measurement matrix $A_{M\times N}$ (M<N) and following the same reasoning steps, IMATCS algorithm can also be derived.

Remark 1:

For tuning the algorithm parameters, note that the step size $\lambda$ must satisfy $$0<\lambda<\frac{2}{\sigma_{max}(S^HS)}=2$$

to avoid possible divergence according to the theory of the gradient algorithm for SE minimization [24, 25]. A prudential choice is to decrease and increase the total number of algorithm iterations. For the adaptive threshold, note that in initial iterations that the current estimate $(X_k)$ is still far from the true signal (X), we need strict projection onto the sparse signal domain But as we proceed closer to the true signal, we need less strict thresholding. Hence, a decreasing threshold value according to $t(k)=\beta e^{-\alpha k}$ seems logical. This threshold value also shows acceptable performance. The parameters $\alpha$, $\beta$ are trained to achieve the best performance for the class of voice signals. Finally for the sparse domain, note that the DCT domain is considered for thresholding as it showed superior performance in comparison with other possible transform domains (FFT and DST) on a statistically sufficient number of voice frames. Note that the reported reconstruction results already outperform both the traditional low pass A/Ds and other sparsity promoting techniques, hence we do not need to learn an optimized dictionary for voice as this would impose additional and redundant complexity on our proposed scheme.

Definition 1

A signal vector X is called interpolatable with regard to a specific sampling matrix S and a specific interpolation method $\mathcal{I}$, if it can be perfectly reconstructed by applying $\mathcal{I}$ on the subset of its samples determined by S.

It is known that interpolatability is a very general signal property that highly depends on the sampling pattern and the interpolation method. As a special case, this property reduces to the well-known lowpass property for uniform samples interpolated by sinc functions.

Corollary 1:

Utilizing definition 1 and taking an approach similar to the proof to theorem 1, IMATI can be easily derived by applying the GP algorithm to the SE minimization problem given by (6). Note that this problem features the additional constraint of interpolatability. As interpolation is a linear operator with regard to a fixed sampling mask S, interpolatability is a convex constraint and hence adding it to the GP procedure does not jeopardize the convergence of the algorithms. IMATI starts from the initial point of $X_0=0$ and projects the direction of movement onto this convex space by $\mathcal{I}(\bullet)$ in each iteration.

$$\text{Argmin}_{\hat{X}} \|Y - S\hat{X}\|_2^2 \quad (6)$$

S. t.

$\hat{X}$ is sparse in an arbitrary basis $\hat{X}$ is interpolatable with regard to S Having derived IMAT and IMATI algorithms, we need to define the basic LC property to enable us derive IMATLC. This property is readily concluded from the initial definition of LC sampling scheme.

Definition 2

The basic LC property states that for the time period between two consecutive LC/ALC samples, the signal keeps among those sample values. In other words if $x(t_i)=x_i$ and $x(t_{i+1})=x_{i+1}$ denote two consecutive LC/ALC samples (suppose $x_i \geq x_{i+1}$), we have $x_{i+1} \leq x(t) \leq x_i$, $\forall t_i \leq t \leq t_{i+1}$.

Although the sparsity promoting algorithms of IMAT and IMATI work fairly well for reconstructing sparse signals from LC/ALC samples, but it is observed that the final signal reconstructed by these methods violates the basic LC property. This phenomenon in turn degrades the final reconstruction performance. To overcome this issue, we propose IMATLC algorithm in Corollary 2.

Corollary 2:

Taking an approach similar to the proof to theorem 1, IMATLC can be easily derived by applying the GP algorithm to the following SE minimization problem (7)

$$\text{Argmin}_{\hat{X}} \|Y - S\hat{X}\|_2^2 \quad (7)$$

S. t.

$\hat{X}$ is sparse in an arbitrary basis $\hat{X}$ satisfies the basic LC property with regard to S According to the GP technique, IMATLC is derived as (8).

$$\text{IMATLC: } X_{k+1} = \mathcal{L} C(T(X_k) \quad (8)$$
$$+\lambda S^t(Y - ST(X_k)))$$

In (8), $\mathcal{L} C(\bullet)$ denotes the LC projection operator and is applied by hard limiting the signal reconstructed between each two consecutive samples to the lower and upper boundaries enforced by the sample values.

It is known that the space of all signals satisfying the basic LC constraint with regard to a fixed sampling mask S is convex, i.e. if two signals satisfy this constraint, any linear combination of them also satisfies the same constraint. IMATLC technique guarantees enforcement of the basic LC constraint by projecting the signal reconstructed in each iteration onto this convex space. Note that as the newly added LC constraint is convex, it does not jeopardize convergence of the overall algorithm and the reasoning is complete.

Table 1 gives the stepwise presentation of the proposed IMATLC algorithm. FIG. 3 also gives the block diagram for IMATLC.

TABLE 1

Stepwise presentation of IMATLC algorithm
IMATLC Algorithm for Sparse Signal Reconstruction
from LC/ALC Samples Inputs:
- $Y_{M \times 1}$: The vector containing the LC/ALC samples
- $S_{M \times N}$: The LC/ALC sampling mask
- $\epsilon$: Stopping criteria
- $(\alpha, \beta, \lambda)$: Algorithm Parameters Output:
- $\hat{X}_{N \times 1}$: The reconstructed signal Algorithm:
- Initialization: $\hat{X} = X_0 = 0_{N \times 1}$, k = 0
- While $(\|X_k - X_{k+1}\|_2 > \epsilon)$
  - Calculate the threshold as: $Th(k) = \beta e^{-\alpha k}$
  - Perform the thresholding and recursion as:
    $X_{k+1} = T(X_k) + \lambda S^t(Y - ST(X_k))$
  - Enforce the basic LC constraint by hard limiters
    - $\hat{X} = X_{k+1}$
    - k = k + 1
- End While I. Conclusion In this paper, we proposed asynchronous and sparsity promoting LC/ALC based A/Ds as a substitute for the conventional uniform sampling based A/Ds for voice. The proposed scheme not only improves signal quality by applying the sparsity promoting family of IMAT algorithms, but also reduces sampling redundancy by signal-dependent LC sampling. We show how IMAT-based reconstruction algorithms can be derived by applying the Gradient Descent (GD) and Gradient Projection (GP) algorithms to the problem of Square Error (SE) minimization subjected to sparsity. This helps us modify the basic IMAT algorithm to propose IMATLC by adding an additional LC sampling constraint to the Square Error (SE) minimization problem solved by IMAT. IMATLC not only outperforms its predecessors (IMAT and IMATI), but also excels other sparsity promoting techniques of OMP, LASSO and SL0 for LC/ALC reconstruction. The simulation results revealed that the proposed A/Ds outperform the conventional low pass A/Ds by avoiding the prerequisite anti-aliasing filter distortion. Finally, we compared the performance of the proposed A/Ds with uniform and random sampling based A/Ds and concluded that LC/ALC is a more practical sampling method that approaches the ideal case of random sampling.

REFERENCES

[1] C. E. Shannon, "A Mathematical Theory of Communication," *Bell Syst. Tech. J.*, vol. 27, pt. I, no. 3, pp. 379-423, 1948; pt. II, no. 4, pp. 623-656, 1948.

[2] A. J. Jerri, "Shannon sampling theorem-its various extensions and applications: A tutorial review," *Proc. IEEE*, vol. 65, no. 11, pp. 1565-1596, November 1977.

[3] J. Mark and T. Todd, "A nonuniform sampling approach to data compression," *IEEE Trans. Comm.*, vol. 29, no. 1, pp. 24-32, January 1981.

[4] Y. Tsividis, "Digital signal processing in continuous time: a possibility for avoiding aliasing and reducing quantization error," *Proceedings of IEEE International Conference on Acoustics, Speech, and Signal Processing (ICASSP '04)*, vol. 2, pp. ii-589-92, May 2004.

[5] E. Allier, G. Sicard, L. Fesquet, M. Renaudin "A new class of asynchronous a/d converters based on time quantization," in *Proc. of ASYNC.*, pp. 196-205, May 2003.

[6] M. Greitans, "Processing of Non-Stationary Signal Using Level-Crossing Sampling," in *Proc. SIGMAP 2006*, pp. 170-177, August 2006.

[7] S Chandra Sekhar and T. V. Sreenivas, "Auditory motivated level crossing approach to instantaneous frequency estimation," *IEEE Trans. Sig. Proc.*, vol. 53, no. 4, pp. 1450-1562, April 2005.

[8] D. Kinniment, A. Yakovlev, F. Xia, and B. Gao, "Towards asynchronous A/D conversion," *International Symposium on Asynchronous Circuits and Systems*, pp. 2-6, 1998.

[9] F. Akopyan, R. Manohar, and A. B. Apsel, "A level-crossing flash asynchronous analog-to-digital converter," *International Symposium on Asynchronous Circuits and Systems*, pp. 12-22, March 2006.

[10] D. Kinniment, A. Yakovlev, and B. Gao, "Synchronous and asynchronous A/D conversion," *IEEE Transactions on Very Large Scale Integration (VLSI) Systems*, vol. 8, pp. 217-220, apr 2000.

[11] Jr. B. F. Logan, "Information in the zero crossings of bandpass signals," *AT&T Technical Journal*, vol. 56, no. 4, pp. 487-510, April 1977.

[12] F. Marvasti, Nonuniform sampling: theory and practice. New York: Springer Press, 2001.

[13] M. Malmirchegini, M. Kafashan, M. Ghassemian, and F. Marvasti, "Non-uniform Sampling based on Adaptive Level Crossing Scheme," *IET Signal Processing Journal*, vol. 9, no. 6, pp. 484-490, 2015.

[14] A. A. Lazar, L. T. Toth, "Perfect recovery and sensitivity analysis of time encoded bandlimited signals," *IEEE Transactions on Circuits and Systems I: Regular Papers*, vol. 51, no. 10, pp. 2060-2073, October 2004.

[15] M. Greitans, and R. Shavelis, "Signal-Dependent Techniques for Non-Stationary Signal Sampling and Reconstruction," 17$^{th}$ *European Signal Processing Conference (EUSIPCO 2009)*, pp. 2613-2617, Scotland, August 2009.

[16] M. Greitans, R. Shavelis, "Speech sampling by level-crossing and its reconstruction using spline-based filtering," 14*th International Workshop on Systems, Signals and Image Processing*, pp. 292-295, June 2007.

[17] S. Senay, L. F. Chaparro, M. Sun, and R. J. Sclabassi, "Adaptive Level Crossing Sampling and Reconstruction," 18$^{th}$ *European Signal Processing Conference (EUSIPCO 2010)*, pp. 1296-1300, Denmark, August 2010.

[18] S. Senay, J. Oh, L. F. Chaparro, "Regularized signal reconstruction for level-crossing sampling using Slepian functions," *Elsevier Signal Processing Journal*, vol. 92, no. 4, pp. 1157-1165, 2012.

[19] R. Kumaresan, N. Panchal, "Encoding Bandpass Signals Using Zero/Level Crossings: A Model-Based Approach," *IEEE Transactions on Audio, Speech, and Language Processing*, vol. 18, no. 1, pp. 17-33, January 2010.

[20] P. T. Boufounos, R. G. Baraniuk, "Reconstructing sparse signals from their zero crossings," *IEEE International Conference on Acoustics, Speech and Signal Processing (ICASSP 2008)*, pp. 3361-3364, 2008.

[21] N. Sharma, T. V. Sreenivas, "Sparse signal reconstruction based on signal dependent non-uniform samples," *IEEE International Conference on Acoustics, Speech and Signal Processing (ICASSP 2012)*, pp. 3453-3456, March 2012.

[22] F. Marvasti, M. Azghani, P. Imani, P. Pakrouh, S. J. Heydari, A. Golmohammadi, A Kazerouni, M M Khalili, "Sparse signal processing using iterative method with adaptive thresholding (IMAT)," 19*th International Conference on Telecommunications (ICT '12)*, pp. 1-6, April 2012.

[23] F. Marvasti, A. Amini et al., "A Unified Approach to Sparse Signal Processing," *EURASIP Journal on Advances in Signal Processing*, vol. 44, 2012.

[24] S. Boyd and L. Vandenberghe, Convex Optimization, Cambridge Univ. Press, 2004.

[25] J. Nocedal and S. J. Wright, Numerical Optimization, Springer Press, 2006.

The invention claimed is:

1. A method for encoding an analog signal to a stream of digital bits, the method comprising:

receiving an analog input signal;

channelizing the analog input signal to N channels, where N is an integer greater than 1;

delaying the analog signal in each channel by a respective delay value of $\tau_i$, where i=1, . . . N;

sampling each delayed signal in each channel at a sub-Nyquist sampling rate of 1/T', where T' is the frame length in which the analog input signal is processed, wherein there are N samples in each frame of length T';

quantizing each sample of each delayed signal in each channel to a predefined set of l voltage levels to generate b bits of digital signal for each delayed signal in each channel, where l is an odd integer;

adjusting a distance d between each consecutive voltage level such that said l voltage levels cover an entire dynamic range of the analog input signal; and serializing the digital signals in each channel to generate a single bit stream of length Nb that represents an entire frame of the input analog signal.

2. The method of claim 1, further comprising reconstructing said single bit stream of length Nb by:

dividing said bit stream of length Nb to N blocks of b bits each;

distributing each block of b bits to a different channel;

converting each b bit block to a corresponding sample value;

using the respective delay values to produce the samples to reconstruct the corresponding frame of the original analog signal from said bit stream.

3. A digital-to-analog converter (DAC) including circuits for performing the method of claim 2.

4. The method of claim 1, further comprising reconstructing said single bit stream of length Nb by:

transforming the single bit stream of length Nb to corresponding sample values;

providing a missing sampled signal on a Nyquist grid ($x_s(n)$), using the sample values;

providing a binary sampling mask s(n) using the delay values $\tau_1, \tau_2, \ldots, \tau_N$; and reconstructing the Nyquist-rate samples by:

$$x_{k+1}(n) = \lambda y(n) + (1-\lambda s(n))\mathfrak{I}(x_k(n)) \qquad (1a)$$

where, x(n) and $x_k(n)$ are the analog input signal a reconstructed version of the analog input signal at the kth iteration, λ is a relaxation parameter that controls convergence of iterations, and $\mathfrak{I}(\cdot)$ denote a thresholding operator.

5. The method of claim 4, wherein the thresholding operator $\mathfrak{I}(\cdot)$ transforms the input signal to a sparse domain, sets signal components with absolute values below a threshold Th(k) to zero, and transforms the signal components back to time domain.

6. The method of claim 4, wherein the thresholding comprises projecting the missing sampled signal onto the sparse signal space defined as a set of all signals having equal or less than a predetermined number of nonzero components in the sparse signal space.

7. A digital-to-analog converter (DAC) including circuits for performing the method of claim 4.

8. The method of claim 1, further comprising reconstructing said single bit stream of length Nb by:
transforming the single bit stream of length Nb to corresponding sample values;
providing a missing sampled signal on a Nyquist grid ($x_s(n)$) using the sample values;
providing a binary sampling mask s(n) using the delay values $\tau_1, \tau_2, \ldots, \tau_N$; and
reconstructing the Nyquist-rate samples by:

$$x_{k+1}(n) = \mathfrak{I}(x_k(n) + \lambda \mathcal{J}(y(n) - s(n)x_k(n)))\quad (1b)$$

where, x(n) and $x_k(n)$ are the analog input signal and a reconstructed version of the analog input signal at the kth iteration, λ is a relaxation parameter that controls convergence of iterations, and $\mathcal{J}(\cdot)$ denote an interpolation operator.

9. A digital-to-analog converter (DAC) including circuits for performing the method of claim 8.

10. An analog-to-digital converter (ADC) including circuits for performing the method of claim 1.

11. A method for encoding an analog signal to a stream of digital bits, the method comprising:
receiving an analog input signal;
channelizing the analog input signal to L channels, where L is an odd integer greater than 1;
sampling the signal in each channel when an amplitude of said signal intersects a respective predefined reference level, wherein the respective predefined reference levels are uniformly spaced as:

$$\mathcal{L} = \left\{ -\frac{L-1}{2}d, -\frac{L-3}{2}d, \ldots, \frac{L-3}{2}d, \frac{L-1}{2}d \right\},$$

where d is the distance between consecutive reference levels;
adjusting the distance d between consecutive reference levels such that said L reference levels cover an entire dynamic range of the analog input signal;
recording cross levels in each channel and determining a crossing direction for each cross level;
encoding a next cross level by a single bit for each level crossing based on the recorded cross level and the crossing direction of the level crossing;
outputting the bit stream corresponding to the crossing levels;
triggering a timer to output a temporal difference between consecutive cross levels;
quantizing the temporal differences with k bits in each channel; and
outputting the quantized temporal differences as another bit stream.

12. The method of claim 11, further comprising:
using the two bit streams of the crossing levels and quantized temporal differences to reconstruct a corresponding frame of the analog input signal,
mapping each corresponding bit of the first bit stream to its corresponding reference level;
generating parallel sample values from the corresponding reference levels by a serial-to parallel converter circuit; and
using sampling instances from the bit stream of the quantized crossing times to produce the samples to reconstruct the corresponding frame of the analog input signal.

13. A digital-to-analog converter (DAC) including circuits for performing the method of claim 12.

14. The method of claim 11, further comprising reconstructing the two said bit streams of the crossing levels and the quantized temporal differences by:
mapping each corresponding bit of the first bit stream to its corresponding reference level;
providing a missing sampled signal on a Nyquist grid ($x_s(n)$) using the reference levels and temporal crossing differences;
providing a binary sampling mask s(n) using the temporal crossing differences; and
reconstructing the Nyquist-rate samples by:

$$x_{k+1}(n) = \lambda y(n) + (1 - \lambda s(n))\mathfrak{I}(x_k(n))\quad (1a)$$

where, x(n) and $x_k(n)$ are the analog input signal and a reconstructed version of the analog input signal at the kth iteration, λ is a relaxation parameter that controls convergence of iterations, and $\mathfrak{I}(\cdot)$ denote a thresholding operator.

15. The method of claim 14, wherein the thresholding operator $\mathfrak{I}(\cdot)$ transforms the analog input signal to a sparse domain, sets signal components with absolute values below a predetermined threshold to zero, and transforms the signal components back to time domain.

16. The method of claim 14, wherein the thresholding comprises projecting the missing sampled signal onto a sparse signal space defined as a set of all signals having equal or less than a predetermined number of nonzero components in the sparse signal space.

17. A digital-to-analog converter (DAC) including circuits for performing the method of claim 14.

18. The method of claim 11, further comprising reconstructing the two said bit streams of the crossing levels and the quantized temporal differences by:
mapping each corresponding bit of the first bit stream to its corresponding reference level;
providing a missing sampled signal on a Nyquist grid ($x_s(n)$) using the reference levels and temporal crossing differences; and
providing a binary sampling mask s(n) using the temporal crossing differences; reconstructing the Nyquist-rate samples by:

$$x_{k+1}(n) = \mathfrak{I}(x_k(n) + \lambda \mathcal{J}(y(n) - s(n)x_k(n)))\quad (1b)$$

where, x(n) and $x_k(n)$ are the analog input signal and a reconstructed version of the analog input signal at the kth iteration, λ is a relaxation parameter that controls convergence of iterations, and $\mathcal{J}(\cdot)$ denote an interpolation operator.

19. A digital-to-analog converter (DAC) including circuits for performing the method of claim 18.

20. An analog-to-digital converter (ADC) including circuits for performing the method of claim 11.

21. A method for encoding an analog signal to a stream of digital bits, the method comprising:
receiving an analog input signal;
channelizing the analog input signal to two or more channels;
sampling the signal in each channel when an amplitude of said signal intersects a respective predefined reference level, wherein the respective predefined reference levels are adaptively increased or decreased by a constant value after each sampling event, and wherein a sequence of level crossings for each sampling event determines whether the reference levels need to be increased or decreased for the next sampling event and is represented by a single overhead bit;
recording the cross level in each channel and determining a crossing direction for each cross level;
encoding a next cross level by a single bit for each level crossing based on the recorded cross level and the crossing direction of the level crossing, wherein the sequence of cross levels for each sampling event determines whether the reference levels need to be increased or decreased for the next sampling event and is represented by a single overhead bit;
triggering a timer to output a temporal difference between consecutive cross levels;
quantizing the temporal differences with k bits in each channel; and
outputting the quantized temporal differences as another bit stream.

22. The method of claim 21, further comprising reconstructing the two said bit streams of the crossing levels and the quantized temporal differences by:
mapping each corresponding bit of the first bit stream to its corresponding reference level;
providing the missing sampled signal on the Nyquist grid ($x_s(n)$) using the reference levels and the temporal crossing differences;
providing the binary sampling mask s(n) using the temporal crossing differences;
reconstructing the Nyquist-rate samples by:

$$x_{k+1}(n) = \lambda y(n) + (1-\lambda s(n)) \Im (x_k(n)) \quad (1a)$$

where, x(n) and $x_k(n)$ are the original input signal and its reconstructed version at the kth iteration, $\lambda$ is a relaxation parameter that controls the convergence of the iterations, and $\Im(\bullet)$ denote a thresholding operator.

23. The method of claim 21, further comprising reconstructing the two said bit streams of the crossing levels and the quantized temporal differences by:
mapping each corresponding bit of the first bit stream to its corresponding reference level;
providing the missing sampled signal on the Nyquist grid ($x_s(n)$) using the reference levels and the temporal crossing differences; and
providing the binary sampling mask s(n) using the temporal crossing differences; reconstructing the Nyquist-rate samples by:

$$x_{k+1}(n) = \Im(x_k(n) + \lambda \mathcal{J}(y(n) - s(n)x_k(n)))) \quad (1b)$$

where, x(n) and $x_k(n)$ are the analog input signal and its reconstructed version at the kth iteration, $\lambda$ is a relaxation parameter that controls the convergence of the iterations, and $\mathcal{J}(\bullet)$ denote an interpolation operator.

* * * * *

UNITED STATES PATENT AND TRADEMARK OFFICE
CERTIFICATE OF CORRECTION

PATENT NO. : 9,729,160 B1
APPLICATION NO. : 15/407981
DATED : August 8, 2017
INVENTOR(S) : Farokh Marvasti et al.

Page 1 of 1

It is certified that error appears in the above-identified patent and that said Letters Patent is hereby corrected as shown below:

In the Claims

Claim 11, Line 42, delete "I;" and insert --1;--

Claim 23, Line 26, delete "$x_{k+1}(n)=\Im(x_k(n)+\lambda \mathcal{J}(y(n)-s(n)x_k(n)))$," and insert
-- $x_{k+1}(n) = \Im(x_k(n) + \lambda \mathcal{J}(y(n) - s(n)x_k(n)))$ --

Signed and Sealed this
Sixteenth Day of April, 2019

Andrei Iancu
*Director of the United States Patent and Trademark Office*